(12) United States Patent
Hu et al.

(10) Patent No.: US 9,472,663 B2
(45) Date of Patent: Oct. 18, 2016

(54) N-TYPE FIELD EFFECT TRANSISTORS, ARRAYS COMPRISING N-TYPE VERTICALLY-ORIENTED TRANSISTORS, METHODS OF FORMING AN N-TYPE FIELD EFFECT TRANSISTOR, AND METHODS OF FORMING AN ARRAY COMPRISING VERTICALLY-ORIENTED N-TYPE TRANSISTORS

(71) Applicant: Micron Technology, Inc., Boise, ID (US)

(72) Inventors: Yongjun Jeff Hu, Boise, ID (US); Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/679,703

(22) Filed: Apr. 6, 2015

(65) Prior Publication Data
US 2015/0214363 A1 Jul. 30, 2015

Related U.S. Application Data

(62) Division of application No. 13/591,073, filed on Aug. 21, 2012, now Pat. No. 9,006,060.

(51) Int. Cl.
*H01L 29/78* (2006.01)
*H01L 29/66* (2006.01)
(Continued)

(52) U.S. Cl.
CPC ..... *H01L 29/7827* (2013.01); *H01L 21/26506* (2013.01); *H01L 21/26513* (2013.01); *H01L 27/108* (2013.01); *H01L 29/161* (2013.01); *H01L 29/167* (2013.01); *H01L 29/36* (2013.01);
(Continued)

(58) Field of Classification Search
CPC ............... H01L 21/26506; H01L 21/26513; H01L 27/108; H01L 29/7827; H01L 29/167; H01L 29/36; H01L 29/66666; H01L 27/10873; H01L 27/10882
See application file for complete search history.

(56) References Cited

U.S. PATENT DOCUMENTS

| 3,562,022 A | 2/1971 | Shifrin |
| 3,865,624 A | 2/1975 | Wilde |

(Continued)

FOREIGN PATENT DOCUMENTS

| KR | 10-2004-0055142 | 6/2004 |
| TW | 200540924 | 12/2005 |

(Continued)

OTHER PUBLICATIONS

Bernstein et al., Effects of Dopant Deposition on p+/n and n+/p Shallow Junctions formed by Plasma Immerson Ion Implantation, IEEE, 2000, 464-467.

(Continued)

*Primary Examiner* — Tucker J Wright
(74) *Attorney, Agent, or Firm* — Wells St. John, P.S.

(57) ABSTRACT

An n-type field effect transistor includes silicon-comprising semiconductor material comprising a pair of source/drain regions having a channel region there-between. At least one of the source/drain regions is conductively doped n-type with at least one of As and P. A conductivity-neutral dopant is in the silicon-comprising semiconductor material in at least one of the channel region and the at least one source/drain region. A gate construction is operatively proximate the channel region. Methods are disclosed.

22 Claims, 19 Drawing Sheets

(51) Int. Cl.
  *H01L 29/161* (2006.01)
  *H01L 29/167* (2006.01)
  *H01L 21/265* (2006.01)
  *H01L 29/36* (2006.01)
  *H01L 27/108* (2006.01)

(52) U.S. Cl.
  CPC ... *H01L 29/66666* (2013.01); *H01L 27/10873* (2013.01); *H01L 27/10882* (2013.01)

(56) References Cited

U.S. PATENT DOCUMENTS

| | | | |
|---|---|---|---|
| 4,673,962 A | 6/1987 | Chatterjee et al. | |
| 4,764,394 A | 8/1988 | Conrad | |
| 4,829,018 A | 5/1989 | Wahlstrom | |
| 4,920,390 A | 4/1990 | Fuse et al. | |
| 5,374,456 A | 12/1994 | Matossian et al. | |
| 5,508,212 A | 4/1996 | Wang et al. | |
| 5,627,390 A | 5/1997 | Maeda et al. | |
| 5,672,541 A | 9/1997 | Booske et al. | |
| 5,828,094 A | 10/1998 | Lee | |
| 5,897,363 A | 4/1999 | Gonzalez et al. | |
| 6,137,713 A | 10/2000 | Kuroda et al. | |
| 6,221,724 B1 | 4/2001 | Yu et al. | |
| 6,225,151 B1 | 5/2001 | Gardner et al. | |
| 6,329,686 B1 | 12/2001 | Lowrey et al. | |
| 6,417,040 B2 | 7/2002 | Noble | |
| 6,492,245 B1 * | 12/2002 | Liu | H01L 21/764 257/E21.008 |
| 6,504,201 B1 | 1/2003 | Noble et al. | |
| 6,563,162 B2 | 5/2003 | Han et al. | |
| 6,582,998 B2 | 6/2003 | Nitta | |
| 6,593,612 B2 | 7/2003 | Gruening et al. | |
| 6,600,191 B2 | 7/2003 | Lowrey et al. | |
| 6,639,846 B2 | 10/2003 | Nikutta | |
| 6,689,660 B1 | 2/2004 | Noble et al. | |
| 6,716,727 B2 | 4/2004 | Walther | |
| 6,977,417 B2 * | 12/2005 | Momiyama | H01L 21/26506 257/335 |
| 6,992,349 B2 | 1/2006 | Lee et al. | |
| 7,012,021 B2 | 3/2006 | Ang et al. | |
| 7,015,091 B1 | 3/2006 | Wu | |
| 7,052,941 B2 | 5/2006 | Lee | |
| 7,074,656 B2 | 7/2006 | Yeo et al. | |
| 7,099,174 B2 | 8/2006 | Thompson et al. | |
| 7,129,538 B2 | 10/2006 | Lee et al. | |
| 7,166,479 B2 | 1/2007 | Zhu et al. | |
| 7,179,703 B2 | 2/2007 | Gonzalez et al. | |
| 7,365,384 B2 | 4/2008 | Tran et al. | |
| 7,456,068 B2 | 11/2008 | Kavalieros et al. | |
| 7,491,641 B2 | 2/2009 | Southwick et al. | |
| 7,501,676 B2 | 3/2009 | Doyle | |
| 7,518,182 B2 | 4/2009 | Abbott et al. | |
| 7,592,212 B2 | 9/2009 | Qin et al. | |
| 7,713,823 B2 | 5/2010 | Sung et al. | |
| 7,736,969 B2 | 6/2010 | Abbott et al. | |
| 7,737,010 B2 | 6/2010 | Qin et al. | |
| 7,768,073 B2 | 8/2010 | Wells | |
| 7,939,409 B2 | 5/2011 | Figura et al. | |
| 7,948,064 B2 | 5/2011 | Barth et al. | |
| 7,956,402 B2 | 6/2011 | Chen et al. | |
| 8,008,158 B2 | 8/2011 | Chang et al. | |
| 8,202,781 B2 | 6/2012 | Kim | |
| 2002/0110039 A1 | 8/2002 | Forbes et al. | |
| 2003/0096490 A1 | 5/2003 | Borland et al. | |
| 2003/0107911 A1 | 6/2003 | Nishihara et al. | |
| 2003/0186519 A1 | 10/2003 | Downey et al. | |
| 2004/0132232 A1 | 7/2004 | Noble | |
| 2004/0195594 A1 | 10/2004 | Tran et al. | |
| 2005/0017281 A1 | 1/2005 | Lowrey | |
| 2005/0079721 A1 | 4/2005 | Buerger, Jr. et al. | |
| 2005/0260838 A1 | 11/2005 | Downey et al. | |
| 2006/0017088 A1 | 1/2006 | Abbott et al. | |
| 2006/0043617 A1 | 3/2006 | Abbott | |
| 2006/0059449 A1 | 3/2006 | Yang et al. | |
| 2006/0081884 A1 * | 4/2006 | Abbott | H01L 27/10841 257/208 |
| 2006/0249770 A1 | 11/2006 | Huo et al. | |
| 2007/0087574 A1 | 4/2007 | Gupta et al. | |
| 2007/0171742 A1 | 7/2007 | Yi | |
| 2007/0243680 A1 | 10/2007 | Harai et al. | |
| 2007/0246783 A1 | 10/2007 | Moon et al. | |
| 2007/0295995 A1 | 12/2007 | Yun et al. | |
| 2008/0142931 A1 | 6/2008 | Sasaki et al. | |
| 2008/0217655 A1 | 9/2008 | Baumann et al. | |
| 2008/0268628 A1 | 10/2008 | Kohli et al. | |
| 2008/0277738 A1 | 11/2008 | Ananthan | |
| 2009/0121268 A1 | 5/2009 | Lee et al. | |
| 2009/0230466 A1 | 9/2009 | Kim | |
| 2009/0256187 A1 | 10/2009 | Kim | |
| 2010/0038709 A1 | 2/2010 | Wang et al. | |
| 2010/0237423 A1 | 9/2010 | Yun et al. | |
| 2011/0019486 A1 | 1/2011 | Jang et al. | |
| 2011/0215391 A1 | 9/2011 | Takaishi | |
| 2011/0215408 A1 | 9/2011 | Tang et al. | |
| 2011/0220994 A1 | 9/2011 | Parekh et al. | |
| 2011/0303974 A1 | 12/2011 | Kim | |
| 2012/0104491 A1 | 5/2012 | Heineck et al. | |
| 2012/0214285 A1 | 8/2012 | Guha et al. | |
| 2013/0168757 A1 | 7/2013 | Hong | |

FOREIGN PATENT DOCUMENTS

| | | |
|---|---|---|
| TW | 102127877 | 4/2015 |
| WO | PCT/US2013/051662 | 11/2013 |
| WO | PCT/US2013/051662 | 3/2015 |

OTHER PUBLICATIONS

Gras-Marti, "Recoil Implanatation Yields and Depth Profiles", Phys. Stat. Sol. (1) 76, 621-627, 1983.

Oh et al., "Characterization of B2H6 Plasma doping for converted p+ Poly-Si Gate", Ion Imiplantation Technology, 2006 American Institute of Physics, pp. 25-28.

Qin et al., "Comparative Study of Self-Sputtering Effects of Different Boron-Based Low-Energy DopingTechniques", IEEE, vol. 37, No. 9, Sep. 2009, pp. 1760-1766.

Rucker et al.; Dopant Diffusion in C-Doped and Si and Ge: Physical Model and Experimental Verification; Institute for Semiconductor Physics; 1999; 4 pp.

* cited by examiner

N-TYPE FIELD EFFECT TRANSISTORS, ARRAYS COMPRISING N-TYPE VERTICALLY-ORIENTED TRANSISTORS, METHODS OF FORMING AN N-TYPE FIELD EFFECT TRANSISTOR, AND METHODS OF FORMING AN ARRAY COMPRISING VERTICALLY-ORIENTED N-TYPE TRANSISTORS

RELATED PATENT DATA

This patent resulted from a divisional application of U.S. patent application Ser. No. 13/591,073 filed Aug. 21, 2012, entitled "N-type Field Effect Transistors, Arrays Comprising N-type Vertically-Oriented Transistors, Methods Of Forming An N-type Field Effect Transistor, And Methods Of Forming An Array Comprising Vertically-Oriented N-type Transistors", naming Yongjun Jeff Hu and Allen McTeer as inventors, the disclosure of which is incorporated by reference.

TECHNICAL FIELD

Embodiments disclosed herein pertain to n-type field effect transistors, to arrays comprising n-type vertically-oriented transistors, to methods of forming an n-type field effect transistor, and to methods of forming an array comprising vertically-oriented n-type transistors

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time, in many instances including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin dielectric. Application of a suitable voltage to the gate allows current to flow from one of the source/drain regions to the other through the channel region. When the voltage is removed from the gate, current is largely prevented from flowing through the channel region. Field-effect transistors may also include additional structure, for example reversibly programmable charge storage regions as part of the gate construction. Transistors other than field-effect transistors, for example bipolar transistors, may additionally or alternately be used in memory cells.

One type of volatile memory is dynamic random access memory (DRAM). Some DRAM memory cells may comprise a field effect transistor coupled with a charge-storage device, such as a capacitor. Other example memory cells may lack capacitors, and instead may use electrically floating transistor bodies. Memory which uses electrically floating transistor bodies to store data may be referred to as zero-capacitor-one-transistor (0C1T) memory, as capacitor-less memory, or as ZRAM™ (zero capacitance DRAM), and may be formed to much higher levels of integration than DRAM.

Regardless, the gates of the transistors may interconnect along rows of the memory cells and form the access lines. The digit or data/sense lines may interconnect with one of the source/drains of each transistor along columns of the memory cells. The data/sense lines may comprise conductively-doped semiconductor material that is continuous between and through one of the source/drain regions of the transistors. The data/sense lines may connect with individual sense amplifiers outside of the memory array. Access lines and data/sense lines may be used in memory arrays wherein the individual memory cells include transistors in addition to or other than field effect transistors. Regardless, it is desirable that the data/sense lines be of high conductivity. Further, it is desirable to minimize parasitic capacitance and cross-talk between immediately adjacent data/sense lines.

Transistors may be used in memory other than DRAM and in other than volatile memory. Further, transistors may be formed in arrays other than memory.

DETAILED DESCRIPTION OF EXAMPLE EMBODIMENTS

Figure 1:
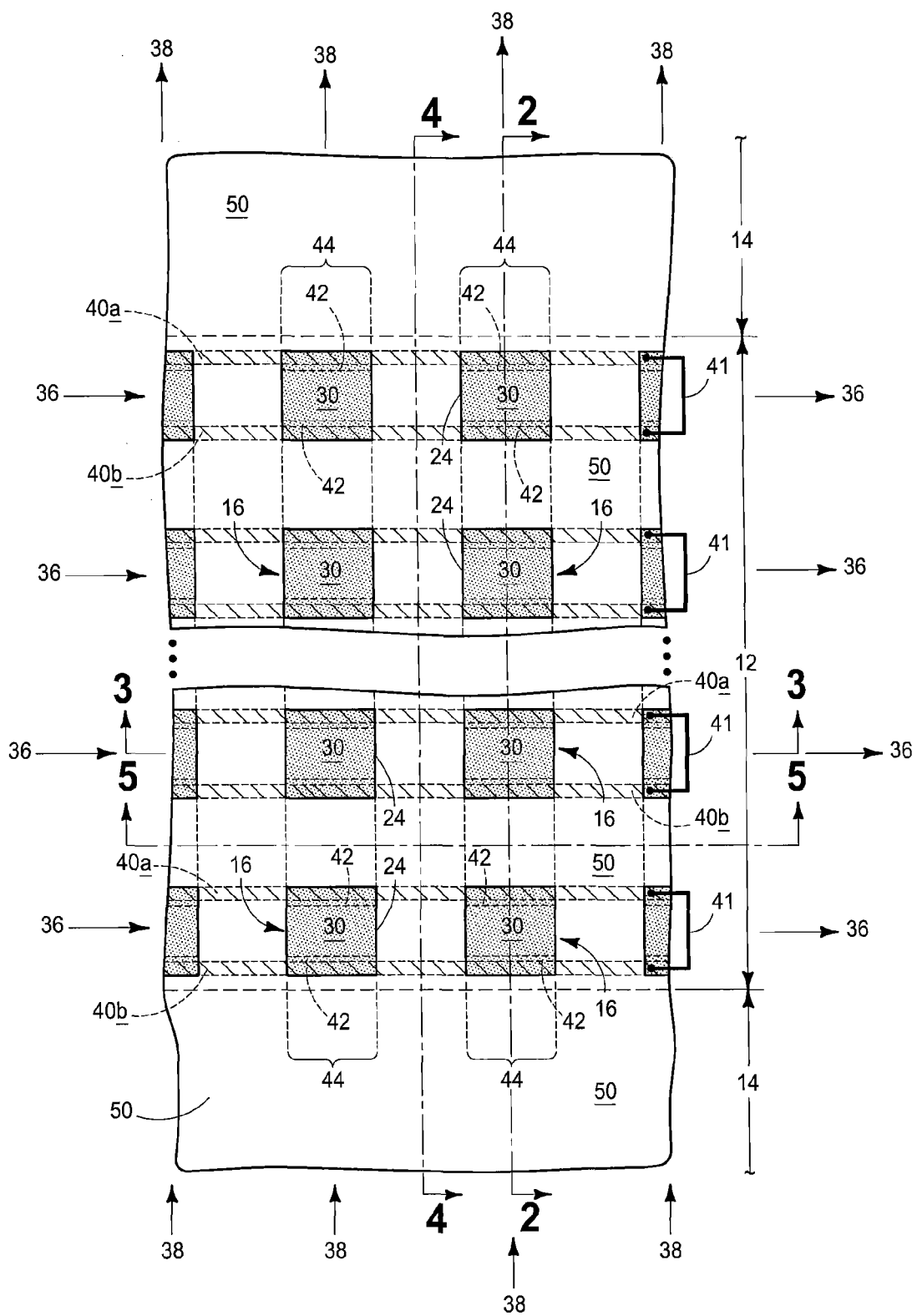
FIG. 1 is a diagrammatic, fragmented, hybrid top plan and schematic view of a substrate fragment comprising an array in accordance with an embodiment of the invention, and which comprises vertically-oriented transistors.

Structure embodiments of the invention include n-type field effect transistors and arrays comprising vertically-oriented transistors. Example embodiments are initially described with reference to FIGS. 1-5. Such show a substrate fragment 10, for example a semiconductor substrate, comprising an array or sub-array area 12 and circuitry area 14 peripheral to array/sub-array area 12. Array 12 includes an array of vertically-oriented transistors 16. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three-dimensional space. Further in this document, words such as "underlying", "under", "lower", "outward", "beneath", "above", and "elevationally" are relative terms corresponding to the vertical direction with respect to the structure being described. Circuitry may be fabricated outside of array 12 (e.g., in area 14) for operating vertically-oriented transistors 16. Control and/or other peripheral circuitry for operating vertically-oriented transistors 16 may or may not wholly or partially be received within array 12, with an example array as a minimum encompassing all of the vertically-oriented transistors (e.g., which may include memory cells) of a given array/sub-array. Further, multiple sub-arrays may also be fabricated and operated independently, in tandem, or otherwise relative one another. As used in this document, a "sub-array" may also be considered as an array.

In some embodiments, the array comprises memory, for example comprising a plurality of individual memory cells which include a generally vertically-oriented transistor. One example is DRAM, although other existing or yet-to-be-developed volatile and non-volatile memory is contemplated. FIGS. 1-5 by way of example show array 12 as comprising a plurality of memory cells 18 which individually include a transistor 16 and a charge storage device 15 (shown schematically in FIGS. 2 and 3). Charge storage device 15 is shown as being a capacitor, although other storage devices or techniques may be used and which may be formed within and/or above substrate fragment 10.

Figure 2:
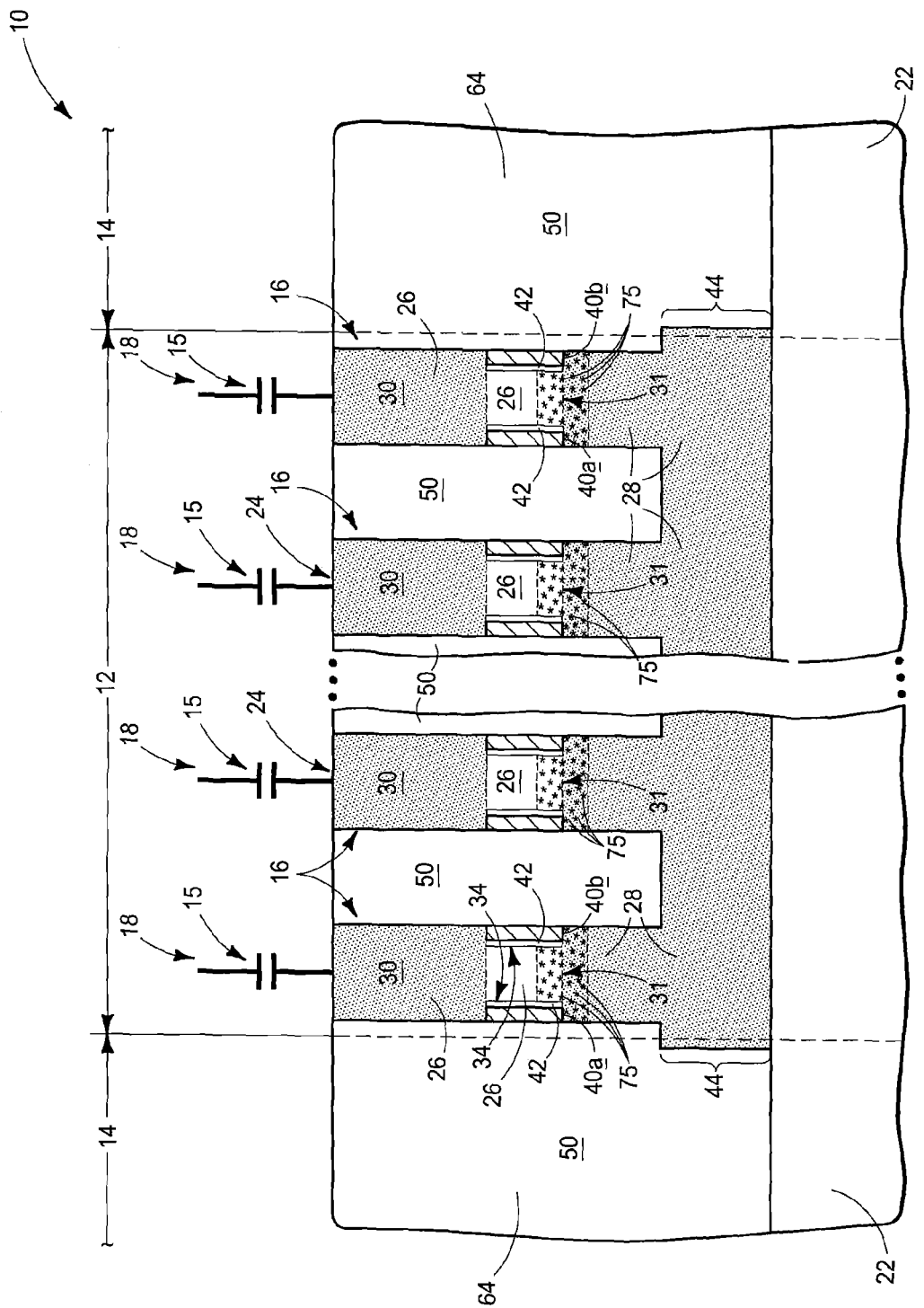
FIG. 2 is a hybrid schematic and structural cross-sectional view taken through line 2-2 in FIG. 1.
Figure 3:
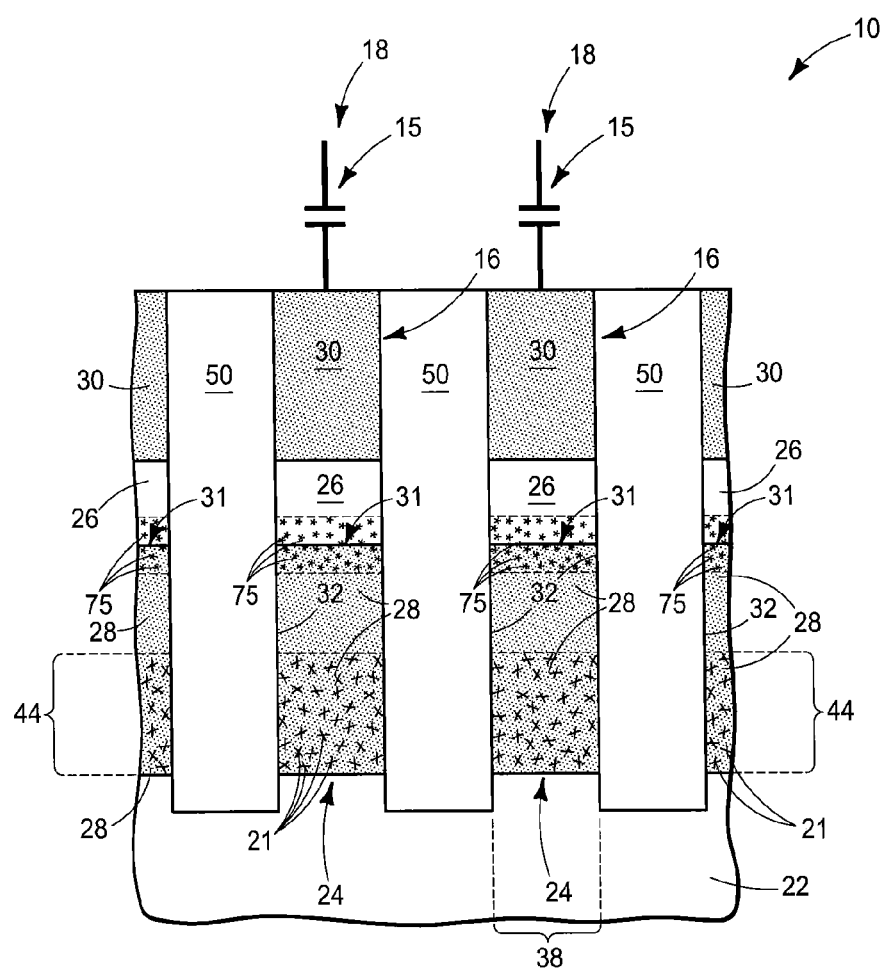
FIG. 3 is a hybrid schematic and structural cross-sectional view taken through line 3-3 in FIG. 1.

Substrate fragment 10 comprises substrate material 22 which may be homogenous or non-homogenous, and may comprise multiple different composition materials, regions, and/or layers. Example materials include semiconductor material, for example bulk monocrystalline silicon lightly background doped with a p-type conductivity-modifying impurity. Other semiconductor materials, including semiconductor-on-insulator substrates, may also be used. In some embodiments and as shown, vertically-oriented transistors 16 are field-effect transistors. FIGS. 1-3 show individual transistors 16 as including semiconductor-comprising pedestals 24 having an elevationally outer source/drain region 30, an elevationally inner source/drain region 28, and a channel region 26 received elevationally between inner source/drain region 28 and outer source/drain region 30. Each may be homogenous or non-homogenous, with suitably doped semiconductor material (e.g., monocrystalline silicon) being examples. Specifically, inner and outer source/drain regions 28, 30, respectively, may comprise highest-doped concentration portions which are suitably conductively-doped with one type of conductivity-modifying impurity, wherein channel region 26 may be doped with a lower concentration of an opposite type impurity. Each region 28 and/or 30 may include one or more of same-type lightly doped regions (e.g., LDD) and of opposite-type doped halo regions (neither of which is specifically designated nor shown). Regardless, individual charge storage devices 15 may electrically couple to respective outer source/drain regions 30. In the context of this document, devices or components are electrically coupled relative one another if electric current continuously flows from one to the other predominately by movement of subatomic positive and/or negative charges when such are sufficiently generated as opposed to predominately by movement of ions. Inner source/drain regions 28 may be considered as having opposing laterally outer sides 32 (FIG. 3). Further, channel regions 26 may be considered as having opposing laterally outer sides 34 (FIG. 2), and in one embodiment which are transversely oriented relative to sides 32 of inner source/drain regions 28.

Array 12 includes rows 36 of access lines and columns 38 of data/sense lines (FIG. 1). Use of "rows" and "columns" in this document is for convenience in distinguishing a series of access lines from a series of data/sense lines. Accordingly, "rows" and "columns" are intended to be synonymous with a series of access lines and a series of data/sense lines, respectively. The rows may be straight and/or curved and/or parallel and/or unparallel relative one another, as may be the columns. Further, the rows and columns may intersect relative one another at 90° or at one or more other angles. In the depicted example, each of the rows and columns are shown as being individually straight and angling relative one another at 90°.

Individual rows comprise an access line which interconnects transistors in that row. One access line or multiple access lines may be used which interconnect transistors in that row. Where multiple access lines are used, such lines may be electrically coupled relative one another. FIGS. 1-4 show individual rows 36 as comprising a pair of access lines 40a, 40b. In one embodiment and as shown, the access lines also form gates for individual field effect transistors, and therefore in some embodiments comprise access gate lines. One of the pair of access lines 40a, 40b is operatively laterally over one of laterally outer sides 34 of channel region 26, with the other of the pair of gate lines 40a, 40b being operatively laterally over the other of laterally outer sides 34 of channel region 26. A gate dielectric 42 is provided laterally between individual access gate lines 40a, 40b and respective channel regions 26. Access lines 40a, 40b may be homogenous or non-homogenous, may be of the same composition or of different compositions relative one another, and will comprise any suitably conductive material(s), for example any one or more of elemental metals, an alloy of elemental metals, a conductive metal compound, and conductively-doped semiconductor material(s). Access lines 40a, 40b are shown to be rectangular in cross section, although any shape may be used. Further, each need not be of the same shape relative the other. Access lines 40a, 40b and gate dielectric 42 are shown as being laterally recessed relative to laterally outermost sides of source/drain regions 28, 30. Alternately, as another example, access lines 40a, 40b and gate dielectric 42 may be received laterally outward of the sides of source/drain regions 28, 30, for example which might simplify fabrication and/or be used to impact operation of transistors 16.

Access lines 40a, 40b within individual rows 36 may be electrically coupled relative one another, for example as shown schematically via respective interconnects 41 (FIG. 1). As an alternate example, gate dielectric may be received circumferentially about the channel regions (not shown), with the access line in a single row encircling that gate dielectric and running continuously as a single access line in the individual rows (not shown).

Individual columns comprise an inner data/sense line elevationally inward of the access lines and which interconnects transistors in that column. One data/sense line or multiple data/sense lines may be used elevationally inward of the access lines for interconnecting transistors in that column. FIGS. 1-5 show individual columns 38 as comprising a data/sense line 44 elevationally inward of access lines 40a, 40b. In one embodiment and as shown, the elevationally inner source/drain regions 28 are continuously connected in individual columns 38 to comprise at least part of the data/sense line 44 in that column (FIG. 2). At least inner/source drain regions 28 are conductively doped n-type with at least one of As and P. Data/sense lines 44 comprise silicon-comprising semiconductor material between the transistors in that column that is conductively-doped n-type (e.g., with at least one of As and P). Ideally, source/drain regions 28 at least where connected with data/sense lines 44 are of the same composition as data/sense lines 44 and may thereby comprise a portion thereof. The As and/or P doping is indicated in the figures with stippling. Example total As and/or P n-type dopant concentration for the highest conductive portions of inner source source/drain regions 28 and data/sense lines 44 is at least $5 \times 10^{19}$ atoms/cm$^3$. Example p-type dopant concentration for channel region 26 is about $1 \times 10^{18}$ atoms/cm$^3$.

Data/sense lines 44 may individually include one or more additional conductive lines (not shown), for example which may be formed of material of greater conductivity than the conductively-doped silicon-comprising material of lines 44. As an example, one or more metal lines (not shown) may be formed against opposing laterally outer sides 32 of inner source/drain regions 28. Example materials for such lines include those described above for access lines 40a, 40b. Alternately as an example, the data/sense lines may only include one or more such metal lines wherein conductively-doped semiconductor material is not received between adjacent inner source/drain regions 28. Regardless, individual columns may comprise one or more outer data/sense lines (not shown) elevationally outward of the access lines and which electrically couple(s) to the inner date/sense line in that column, for example as disclosed in U.S. patent application Ser. No. 13/413,402 filed on Mar. 6, 2012, (now U.S. Patent Publication No. 2013/0235642), naming Lars P. Heineck and Jonathan T. Doebler as inventors, and entitled "Arrays Of Vertically-Oriented Transistors, Memory Arrays Including Vertically-Oriented Transistors, And Memory Cells". Such constructions may lower the overall resistance of the data/sense lines to sense amplifiers external of the array. Additionally, such constructions may lower the ratio of data/sense line-to-data/sense line capacitance to data/sense line-to-world capacitance, thus perhaps improving the final signal delivered to individual sense amplifiers.

Figure 4:
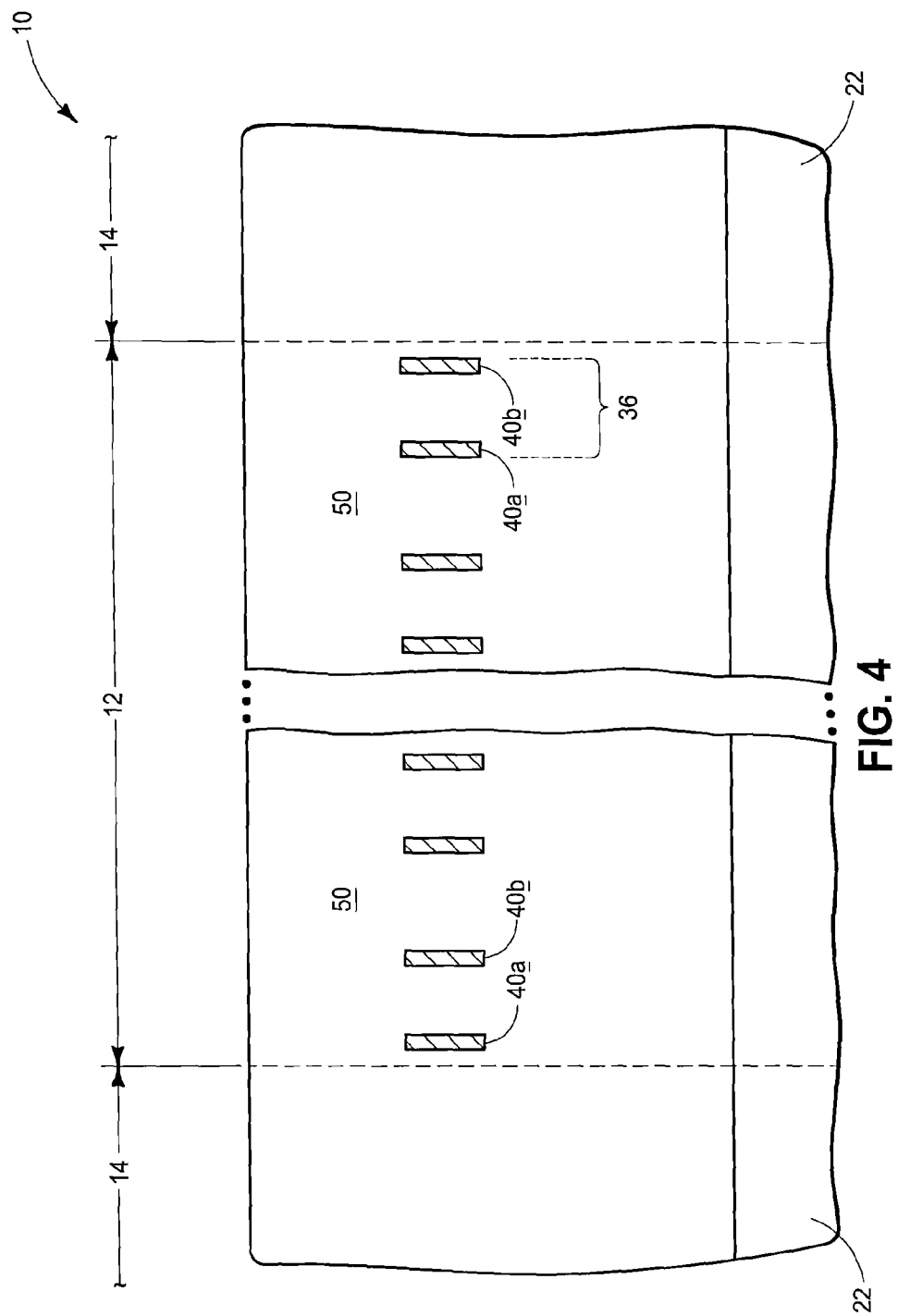
FIG. 4 is a structural cross-sectional view taken through line 4-4 in FIG. 1.
Figure 5:
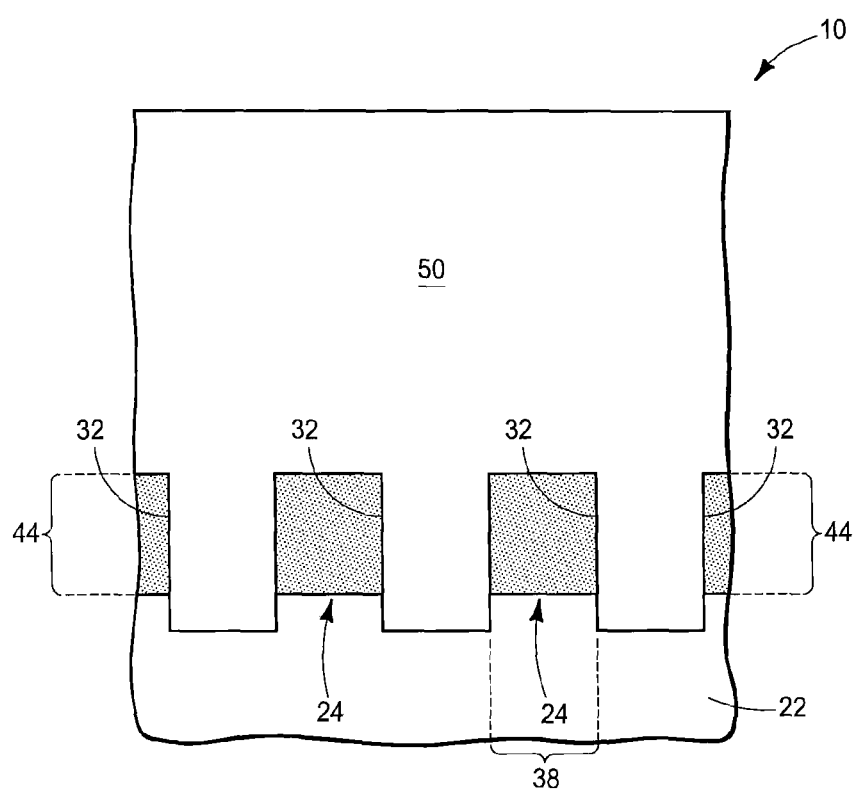
FIG. 5 is a structural cross-sectional view taken through line 5-5 in FIG. 5.

Dielectric material 50 is received about transistors 16, including access lines 40a, 40b, data/sense lines 44, and semiconductor-comprising pedestals 24. Dielectric material 50 may be homogenous or non-homogenous, with silicon nitride and boron and/or phosphorous doped silicon dioxide being examples. Access gate lines 40a, 40b are shown with diagonal hatching for distinguishing clarity in FIG. 1, although such are received within dielectric material 50 as shown in FIGS. 2-4.

Semiconductor-comprising pedestals 24 and data/sense lines 44 are diagrammatically shown as having vertical, straight, and aligned sidewalls. However, such may not be so-provided and may for example include arcuate and/or angled portions which may or may not align.

Silicon-comprising semiconductor material 22 comprises a conductivity-neutral dopant in at least one of channel region 26 and inner source/drain 28. In the context of this document a "conductivity-neutral dopant" is conductivity-neutral to semiconductor properties in silicon and provided at a concentration that is insufficient to appreciably form a stoichiometric compound with silicon if such dopant is even capable of forming a stoichiometric compound with silicon. In one embodiment, the conductivity-neutral dopant is at a concentration of about $1 \times 10^{19}$ atoms/cm$^3$ to about $1 \times 10^{22}$ atoms/cm$^3$ where received in the silicon-comprising semiconductor material. In one embodiment, the conductivity-neutral dopant is provided to be substantially horizontally homogenous where received in the channel region and/or inner source/drain region.

Example conductivity-neutral dopants include N, O, S, and C. Regardless, the conductivity-neutral dopant may have no function in operation in the final circuitry construction of the transistors. However, conductivity-neutral dopants will have required attributes in method embodiments as described below. In one embodiment, the n-type dopant comprises P and the conductivity-neutral dopant comprises N. In one embodiment, the n-type dopant comprises P and the conductivity-neutral dopant comprises C.

In one embodiment, the conductivity-neutral dopant is provided in the inner source/drain region, and in one embodiment only in the inner source/drain region. Regardless, when so-provided the conductivity-neutral dopant may be provided in all or less than all of the inner source/drain region. In one embodiment, the conductivity-neutral dopant is provided in the channel region, and in one embodiment only in the channel region. Regardless, when so-provided the conductivity-neutral dopant may be provided in all or less than all of the channel region.

In one embodiment, the conductivity-neutral dopant is provided both in the channel region and in the inner source/drain region. In one embodiment when so provided, the conductivity-neutral dopant may be provided across an interface of the channel region and the inner source/drain region. For example, FIGS. 2 and 3 show conductivity-neutral dopant 75 provided across an interface 31 of channel region 26 and inner source/drain region 28. Conductivity-neutral dopant 21 may also be provided across an interface of channel region 26 and outer source/drain region 30 (not shown), or otherwise with respect to outer source/drain region 30 as described above with respect to inner source/drain region 28.

Embodiments of the invention also include an n-type field effect transistor regardless of orientation. Such a transistor includes silicon-comprising semiconductor material which comprises a pair of source/drain regions having a channel region there-between. At least one of the source/drain regions is conductively doped n-type with at least one of As and P. The silicon-comprising semiconductor material comprises a conductivity-neutral dopant in at least one of the channel region and the at least one source/drain. Such conductivity-neutral dopant is as described above. A gate construction is provided operatively proximate the channel region. Such an n-type field effect transistor may have any of the other constructional attributes described above in connection with the FIGS. 1-5 embodiments.

Structures in accordance with embodiments of the invention may be fabricated using any existing or yet-to-be-developed techniques. For example, processing may occur at least in part as described in any one or more of U.S. patent application Ser. No. 12/917,346 filed on Nov. 1, 2010 (now U.S. Pat. No. 8,361,856), naming Lars P. Heineck and Jaydip Guha as inventors, and entitled "Memory Cells, Arrays Of Memory Cells, And Methods Of Forming Memory Cells"; U.S. patent application Ser. No. 13/031,829 filed on Feb. 22, 2011 (now U.S. Pat. No. 8,450,175), naming Jaydip Guha, Shyam Surthi, Suraj J. Mathew, Kamal M. Karda, and Hung-Ming Tsai as inventors, and entitled "Methods Of Forming A Vertical Transistor And At Least A Conductive Line Electrically Coupled Therewith, Methods Of Forming Memory Cells, And Methods Of Forming Arrays Of Memory Cells"; and U.S. patent application Ser. No. 13/413,402 filed on Mar. 6, 2012 (now U.S. Patent Publication No. 2013/0235642), naming Lars P. Heineck and Jonathan T. Doebler as inventors, and entitled "Arrays Of Vertically-Oriented Transistors, Memory Arrays Including Vertically-Oriented Transistors, And Memory Cells".

Further and regardless, embodiments of the invention include methods of forming an array comprising vertically-oriented transistors. Additionally, embodiments of the invention include methods of forming an n-type field effect transistor of any orientation. Further, aspects of the structure embodiments are not limited by the method embodiments, or vice versa.

Figure 6:
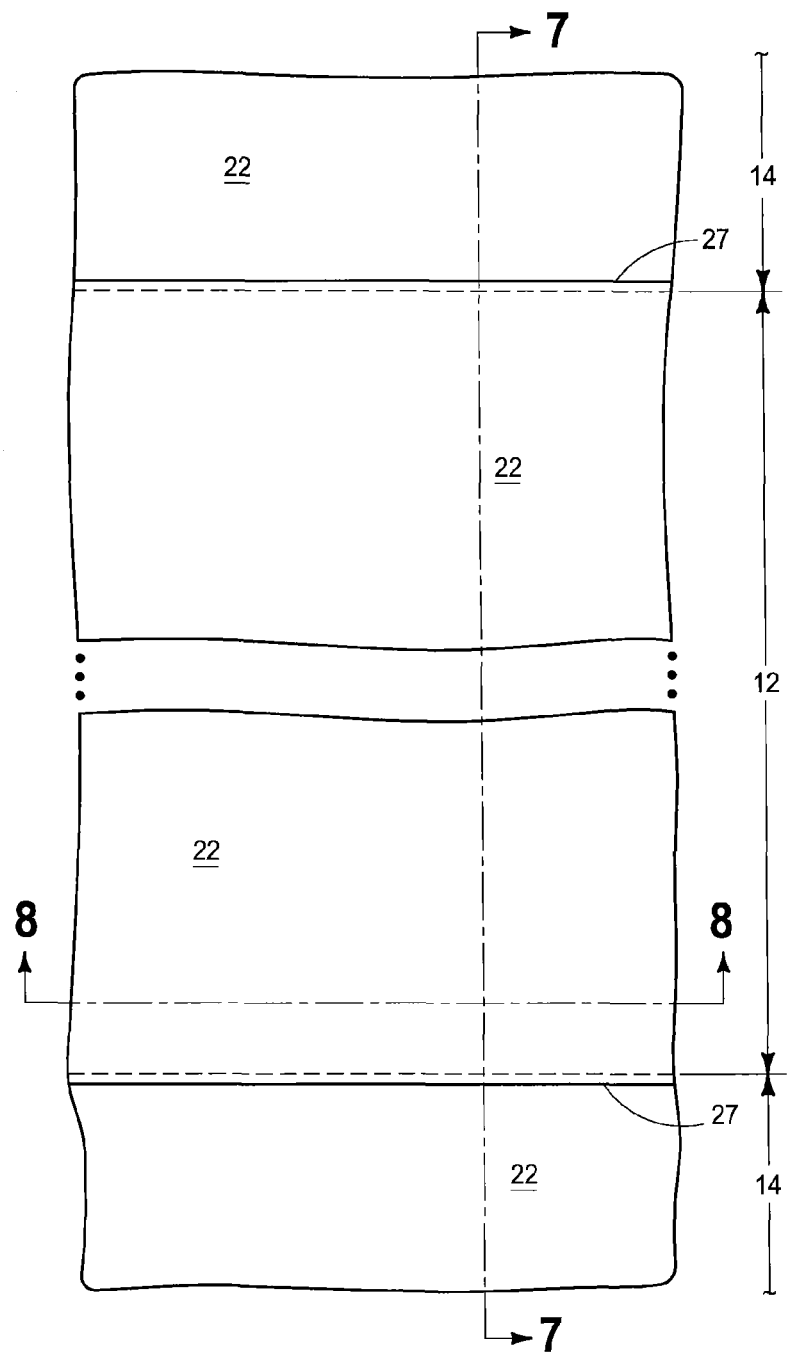
FIG. 6 is a diagrammatic top plan view of a substrate fragment in process in accordance with an embodiment of the invention.
Figure 7:
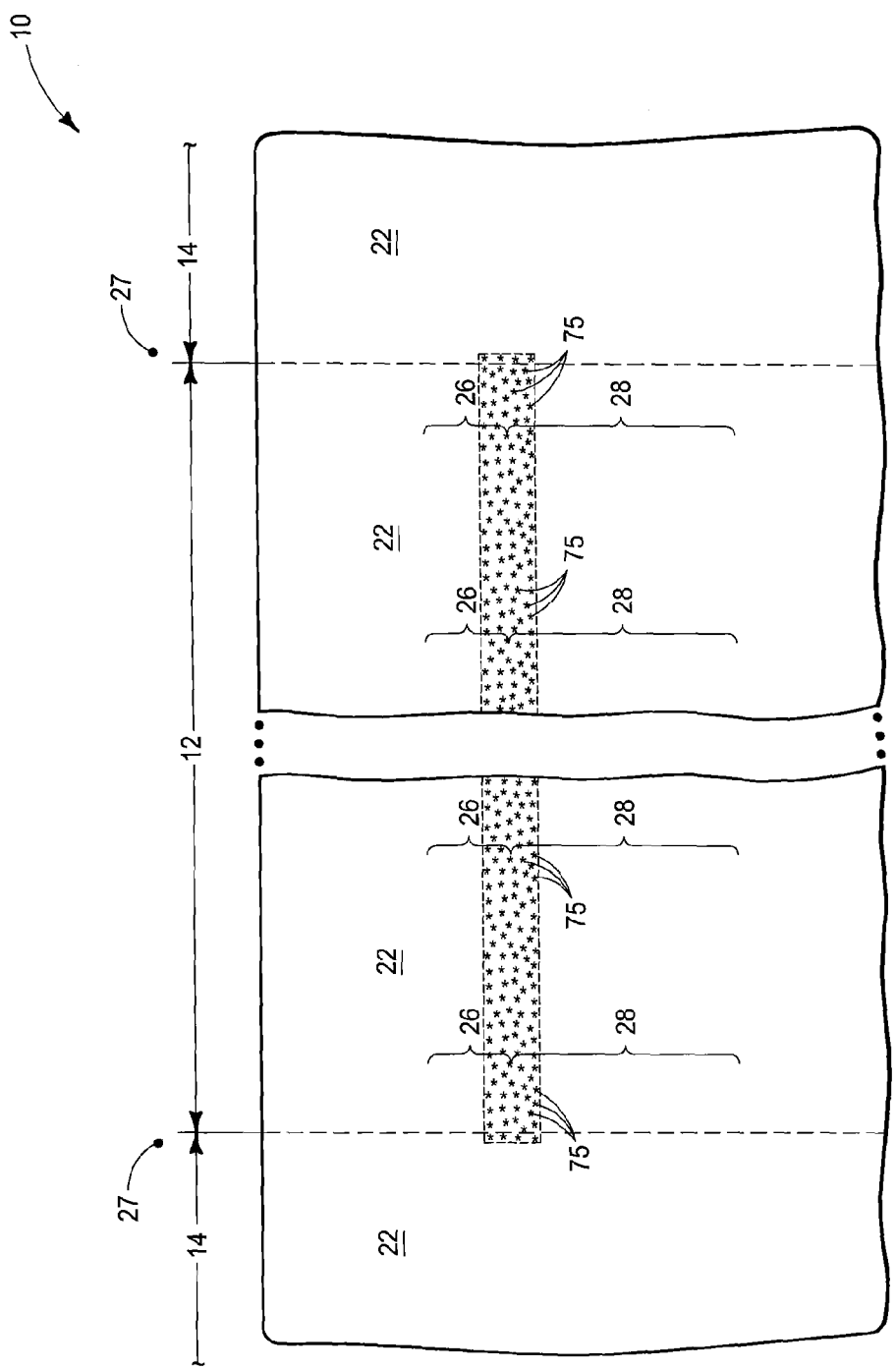
FIG. 7 is a cross-sectional view taken through line 7-7 in FIG. 6.
Figure 8:
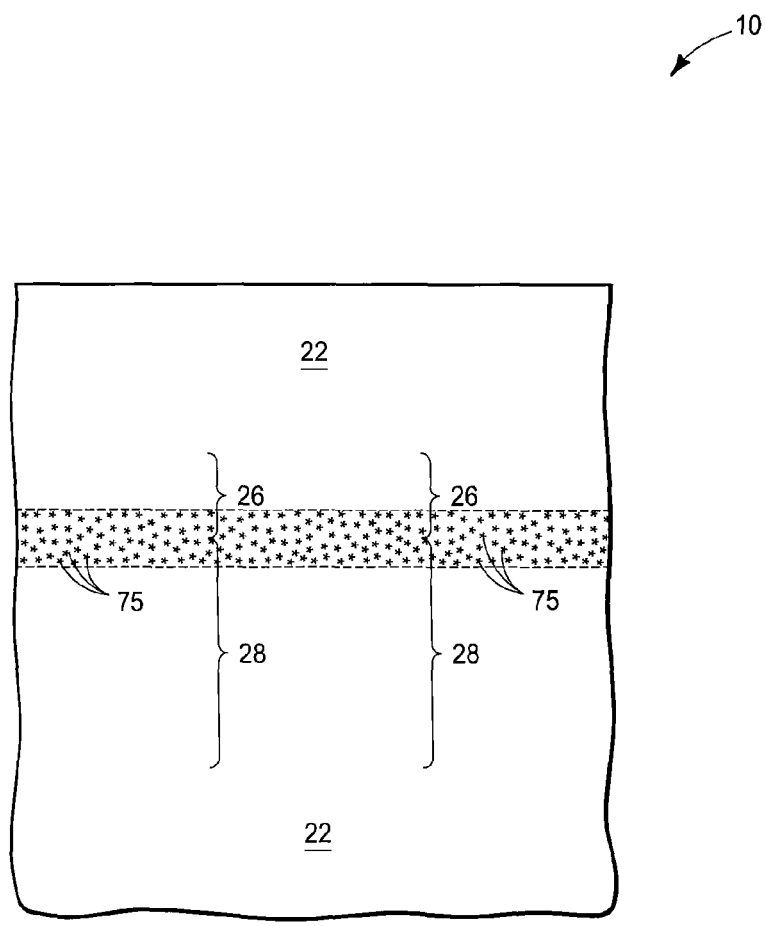
FIG. 8 is a cross-sectional view taken through line 8-8 in FIG. 6.

Example method embodiments of the invention are next described with reference to FIGS. 6-15, for example in fabricating the largely finished-construction circuitry of FIGS. 1-5. Accordingly, like numerals from FIGS. 1-5 for the same components or materials are also used in FIGS. 6-15. For example, FIGS. 6-8 show a predecessor substrate fragment 10 that includes silicon-comprising semiconductor material 22. Array 12 and peripheral regions 14 are shown, although such may not yet be distinguishable relative the other. Conductivity-neutral dopant 75 has been ion implanted into silicon-comprising semiconductor material in at least one of a location of the channel region and a location of the inner source/drain region of individual of the vertically-oriented transistors being formed. Channel region locations 26 and inner source/drain region locations 28 are indicated with respective brackets where such regions will ultimately be formed. FIGS. 6-8 show conductivity-neutral dopant 75 as being within both of channel region locations 26 and inner source/drain locations 28 for fabrication of the example construction of FIGS. 1-5. Regardless, conductivity-neutral dopant in accordance with method embodiments is selected to restrict diffusion of the at least one of As and P in silicon-comprising semiconductor material 22 from inner source/drain region location 28 to channel region location 26 under a set of heating conditions than would otherwise occur under the set of heating conditions in the absence of the conductivity-neutral dopant. Examples include N, O, and S for each of As and P, with N of such group being ideal. As an additional possibility where the n-type dopant comprises P, the conductivity-neutral dopant may comprise C. The artisan can select suitable implant energy and dose to achieve desired depth, elevational spread, and resultant concentration of the implant specie/ species.

In one example embodiment, the conductivity-neutral dopant is ion implanted blanketly across a single continuous horizontal area of the silicon-comprising semiconductor material, for example the horizontal area that would be bounded between lines 27 (FIGS. 6 and 7). FIGS. 6-8 also show an example embodiment wherein the conductivity-neutral dopant has not largely been provided throughout peripheral region 14. Alternately, such may be so provided, for example in either patterned or blanket manners. In one embodiment the conductivity-neutral dopant is provided to be substantially horizontally homogenous where received in the silicon-comprising semiconductor material. An example thickness range for the region comprising conductivity-neutral dopant is from about 50 Angstroms to about 2,000 Angstroms. Example conductivity-neutral dopant concentrations are as described above with respect to dopant 75 in the example finished-circuitry construction of FIGS. 1-5.

Figure 9:
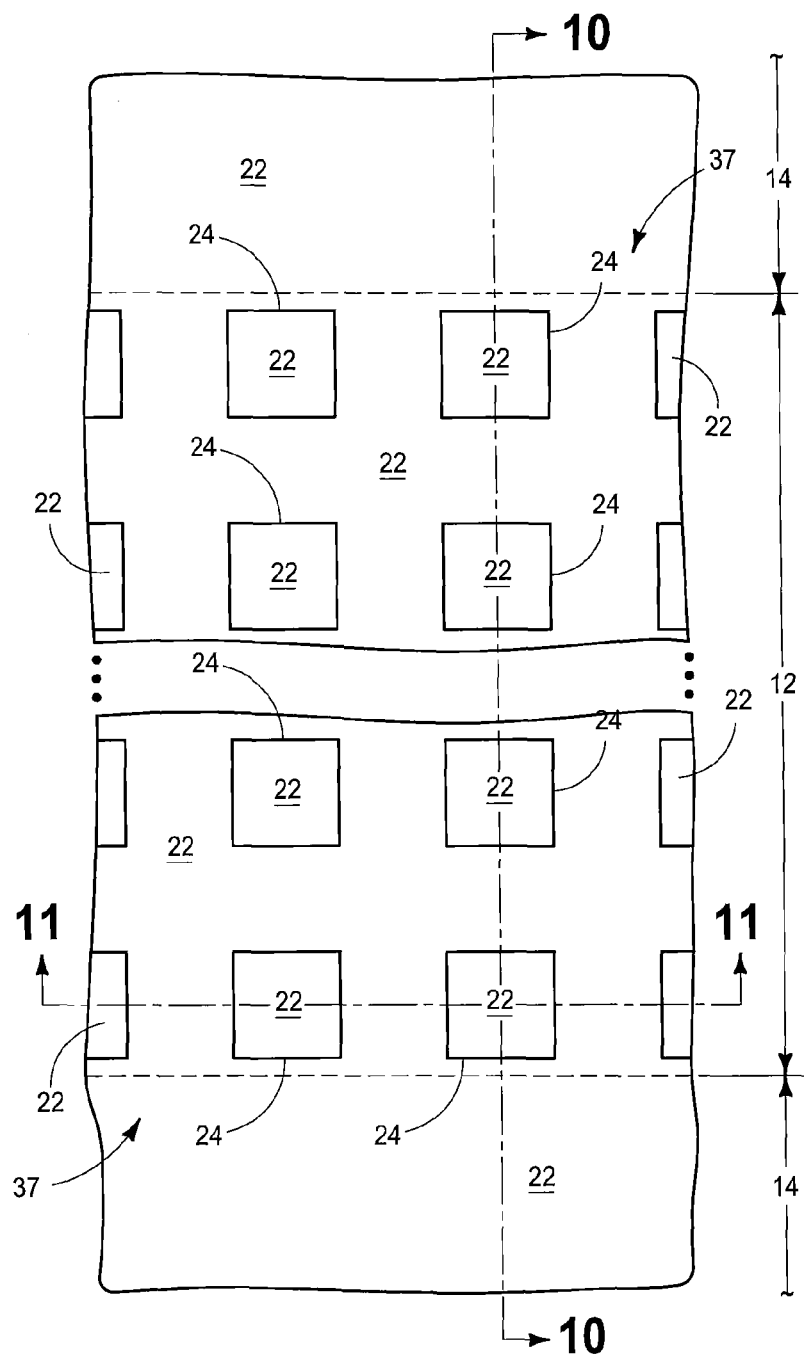
FIG. 9 is a view of the FIG. 6 substrate fragment at a processing step subsequent to that shown by FIG. 6.
Figure 10:
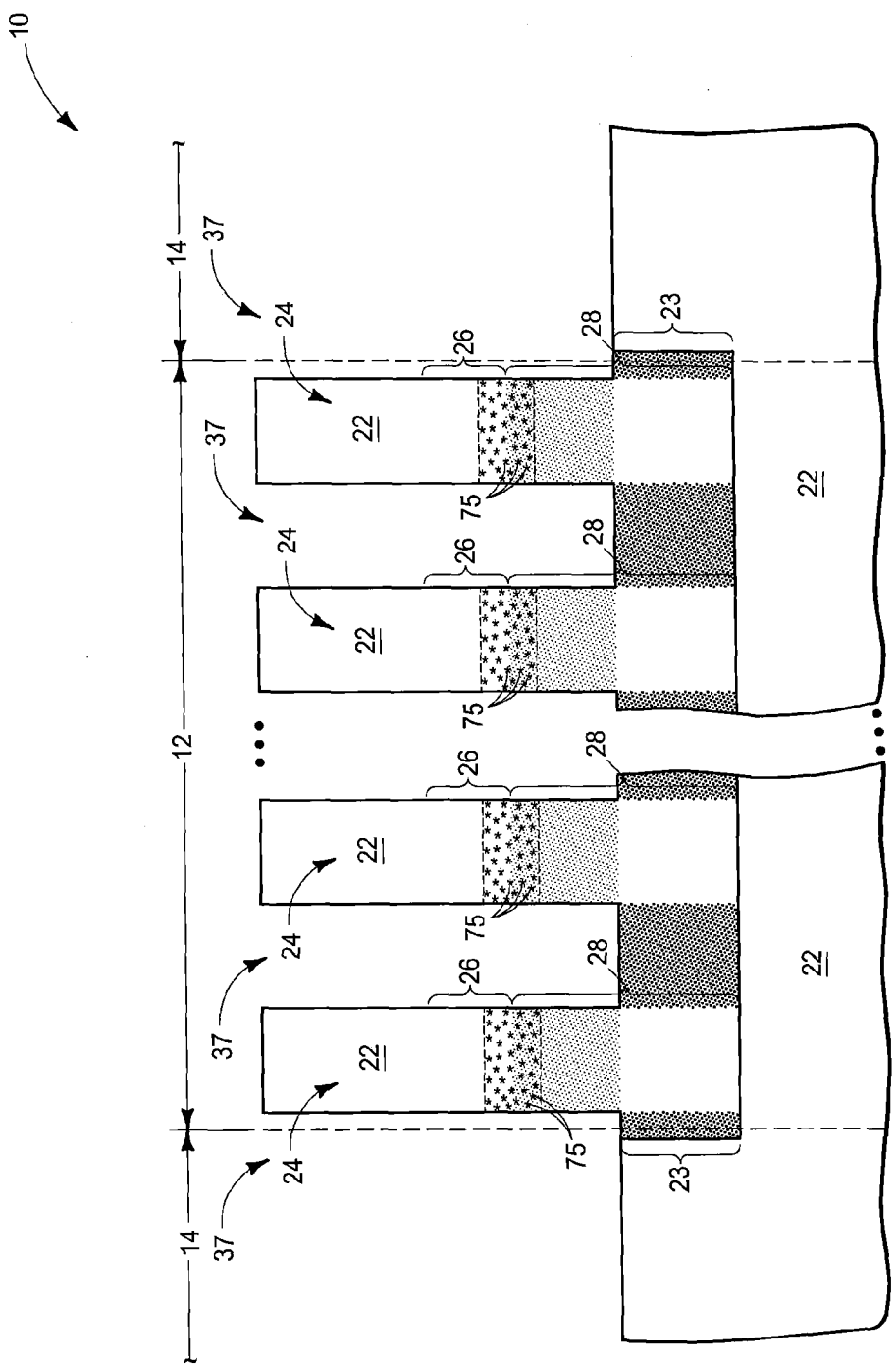
FIG. 10 is a cross-sectional view taken through line 10-10 in FIG. 9.
Figure 11:
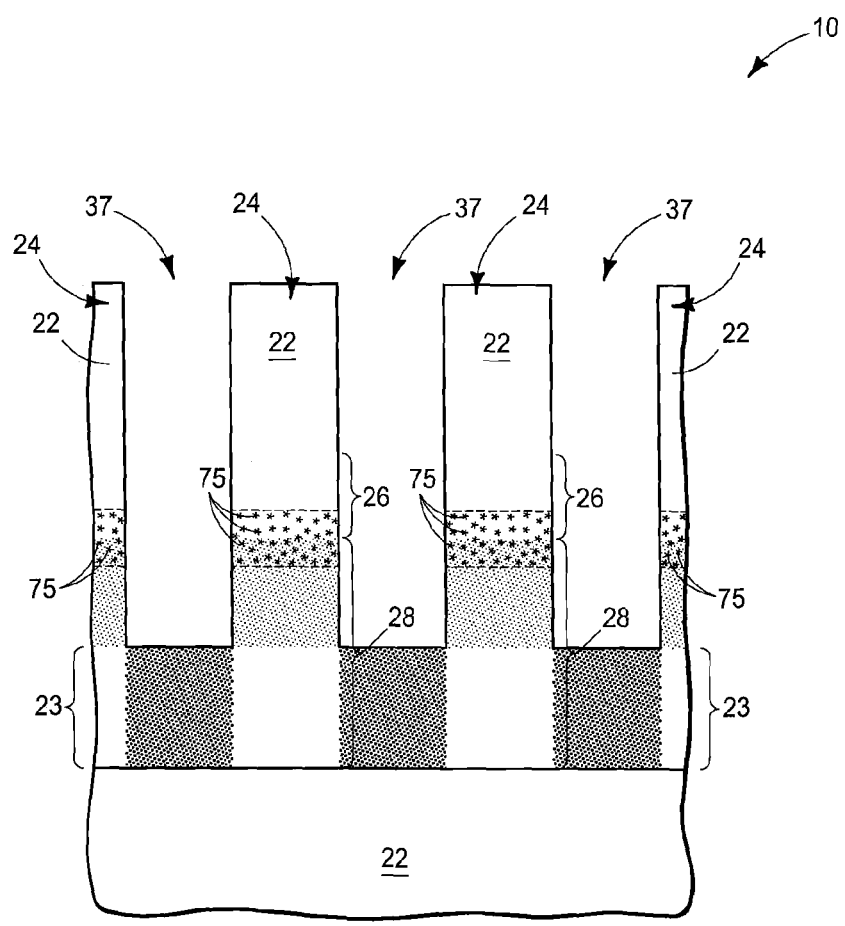
FIG. 11 is a cross-sectional view taken through line 11-11 in FIG. 9.

Referring to FIGS. 9-11 opening/openings 37 have been formed through silicon-comprising semiconductor material 22. An upper portion of individual locations 28 are shown as having been doped n-type, for example to constitute lightly-doped drain (LDD) regions. Where provided, an example technique is by ion implantation, and which may occur earlier or later in the process than shown by FIGS. 10 and 11. For example, such an LDD implant may be conducted into material 22 before or after etching to form some or all of opening/openings 37. Further, LDD regions may be formed in whole or in part by out-diffusion of As and/or P that has been provided in areas remote from the upper portions of locations 28, as will be described below.

FIGS. 9-11 show semiconductor-comprising pedestals 24 have been partially formed whereby openings 37 appear as a single continuous opening in FIG. 9. Alternately and only by way of example, only parallel trenches may be etched into material 22 at this point in the process. For example, parallel trenches (not shown) may be etched into silicon-comprising semiconductor material 22 between columns 38 in FIG. 1, thereby forming rails (not shown) of silicon-comprising semiconductor material 22 between such trenches. Further, those trenches may initially only be etched into material 22 to have bases that are proximate the uppermost portions of locations 28, and perhaps followed by an LDD and/or halo implant. Then, those trenches could be etched deeper to the depth shown in FIGS. 9 and 11. Alternately, such trenches could be initially etched to the depth shown regardless of when or if LDD and/or halo regions are ever formed. Subsequently, trenches orthogonal thereto, as an example, may be etched to form pedestals 24. However, pedestals 24 as shown in FIGS. 9-11 may not be formed at this point in the process. Accordingly and regardless, opening/openings 37 and/or trenches may be formed in one or more etching and/or masking steps.

Semiconductor-comprising pedestals 24 in FIGS. 9-11 are diagrammatically shown as having vertical, straight, and aligned sidewalls. However, such may not be so-provided and may for example include arcuate and/or angled portions regardless of any alignment. Further, silicon-comprising semiconductor material 22 of the pedestals or trenches may be lined with one or more dielectric materials during processing (not shown), and which may comprise a portion of dielectric 50 in the finished-circuitry construction.

Regardless, in one embodiment, FIGS. 10 and 11 show ion implanting having been conducted of at least one n-type impurity into an elevational region 23 laterally adjacent locations 28 where inner source/drain regions will be formed (shown by darker stippling). If opening/openings 37 are formed in two separate orthogonal trench masking steps as described above, the conductively-doped n-type regions may solely extend in parallel lines at this point in the process, for example along lines between column lines 38 of FIG. 1 (not shown in FIGS. 10 and 11). Regardless, that n-type dopant impurity will ultimately diffuse into adjacent locations 28. The n-type dopant provided in the implanted regions is provided at a concentration that is sufficient to ultimately render the silicon-comprising semiconductor material within which the dopant is received electrically conductive, and to render at least the lowest-most portions of regions 28 electrically conductive after the n-type dopant diffuses therein. Regardless, at least one of As and P are ultimately provided into the silicon-comprising semiconductor material in the inner source/drain regions locations to at least partially form the inner source/drain regions.

Figure 12:
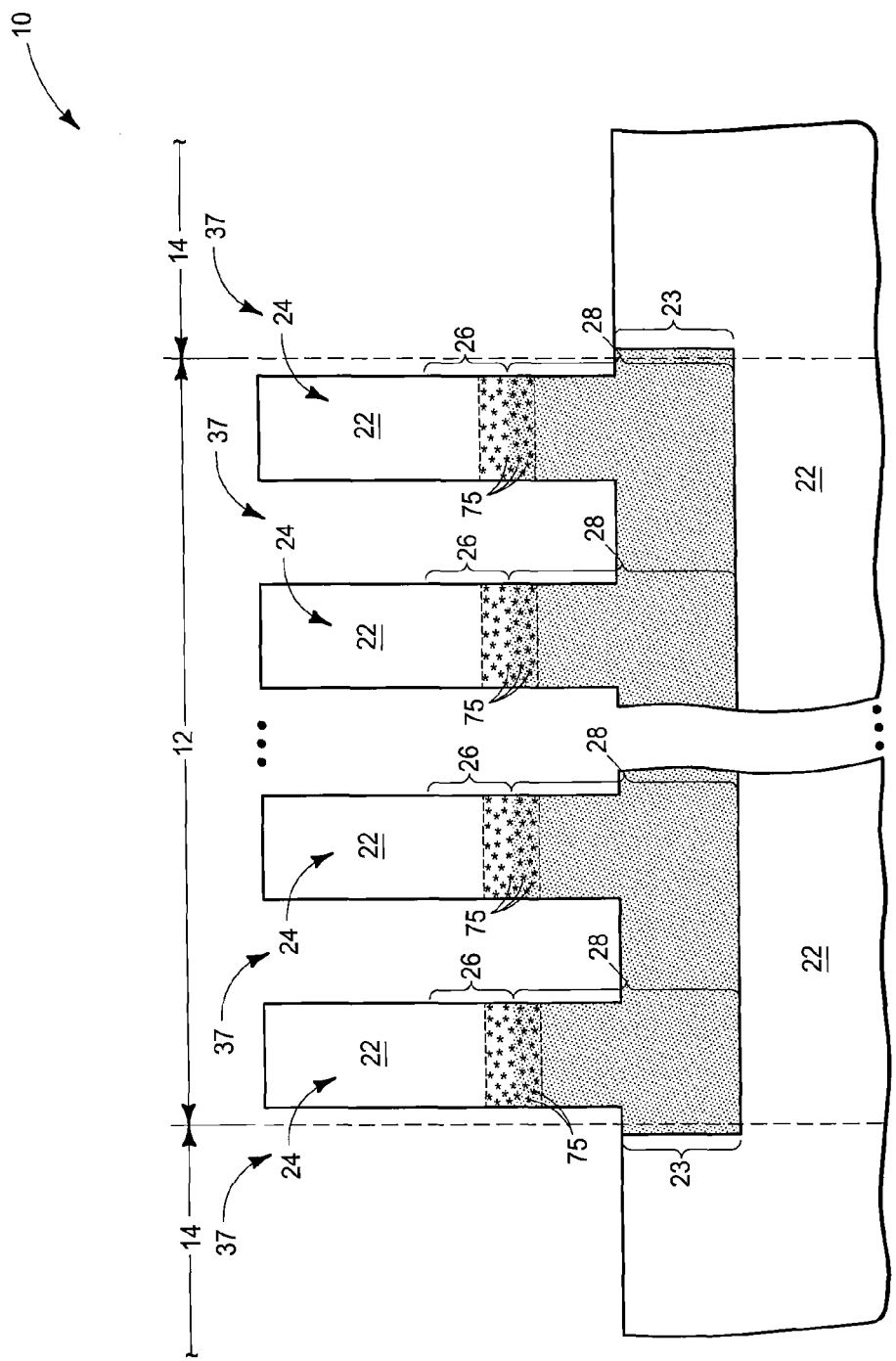
FIG. 12 is a view of the FIG. 10 substrate fragment at a processing step subsequent to that shown by FIG. 10, and corresponds in processing sequence to that of FIG. 13.
Figure 13:
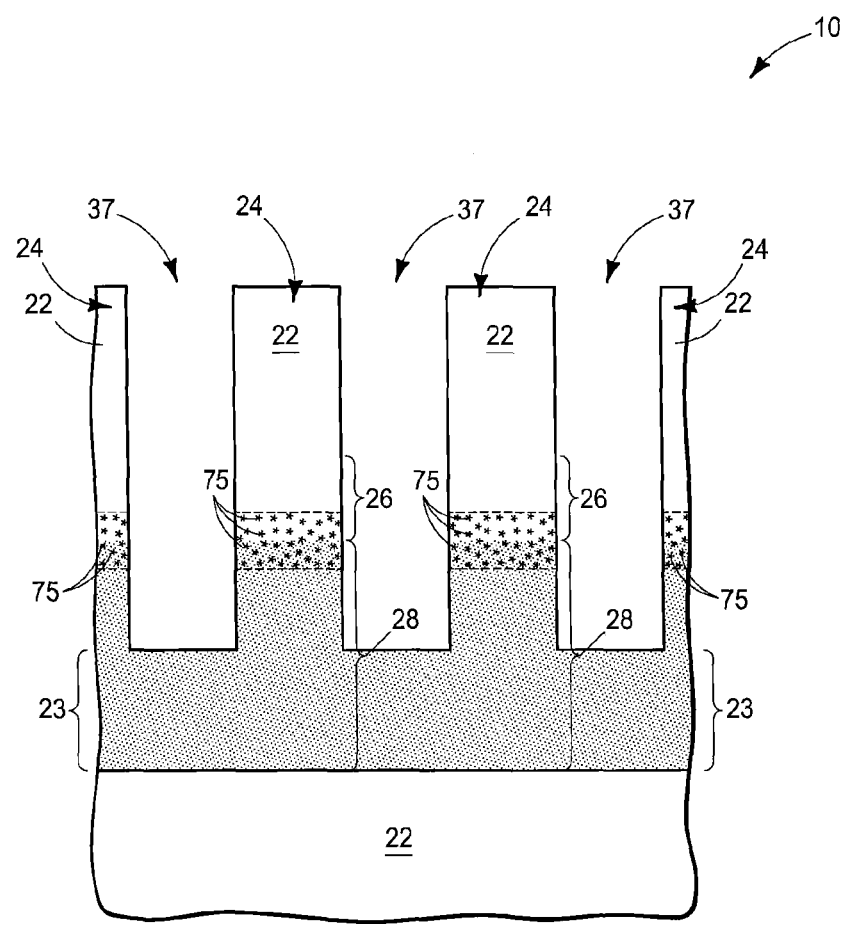
FIG. 13 is a view of the FIG. 11 substrate fragment at a processing step subsequent to that shown by FIG. 11, and corresponds in processing sequence to that of FIG. 12.

Referring to FIGS. 12 and 13, the silicon-comprising semiconductor material 22 within which conductivity-neutral dopant 75 is received has been subjected to the set of heating conditions. The conductivity-neutral dopant restricts diffusion of the As and/or P in the silicon-comprising semiconductor material from inner source/drain region locations 28 to channel region locations 26 than would otherwise occur under the set of heating conditions in the absence of the conductivity-neutral dopant. Example conditions include subjecting the substrate to 900° C. for about 30 minutes in an inert atmosphere. In one embodiment, the set of conditions is sufficient to act as a dopant activation anneal for activating the As, P, and/or other n-type dopant(s). In one embodiment, the set of conditions may be used to diffuse As, P, and/or other n-type dopant(s) in forming LDD regions proximate channel regions 26 as part of inner source/drain regions 28 particularly where such are not provided separately by ion implantation or other manner. Precluding, or at least reducing, As and/or P diffusion from inner source/drain regions 28 into channel regions 26 may improve access device sub-threshold slope.

Figure 14:
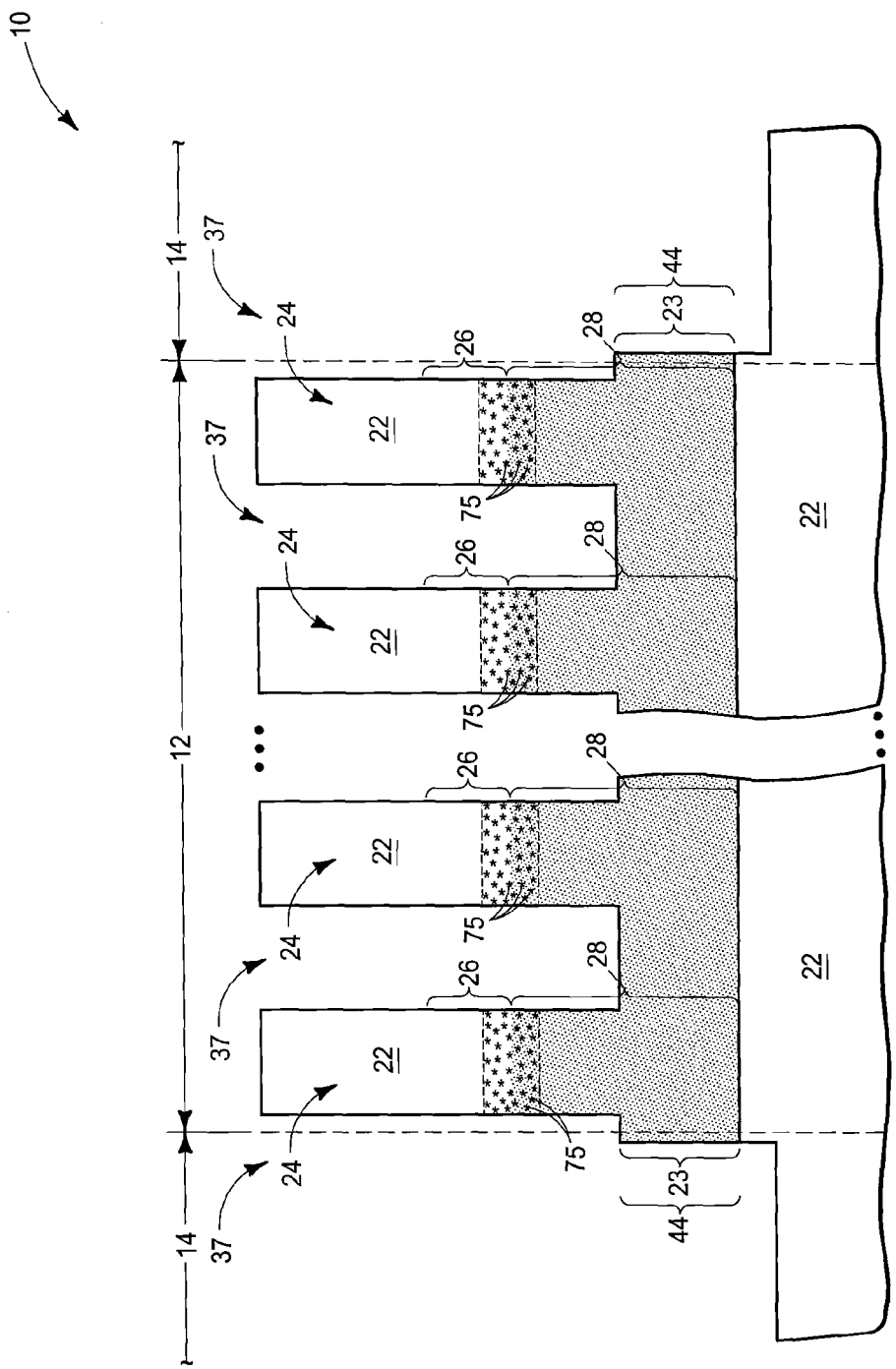
FIG. 14 is a view of the FIG. 12 substrate fragment at a processing step subsequent to that shown by FIG. 12, and corresponds in processing sequence to that of FIG. 15.
Figure 15:
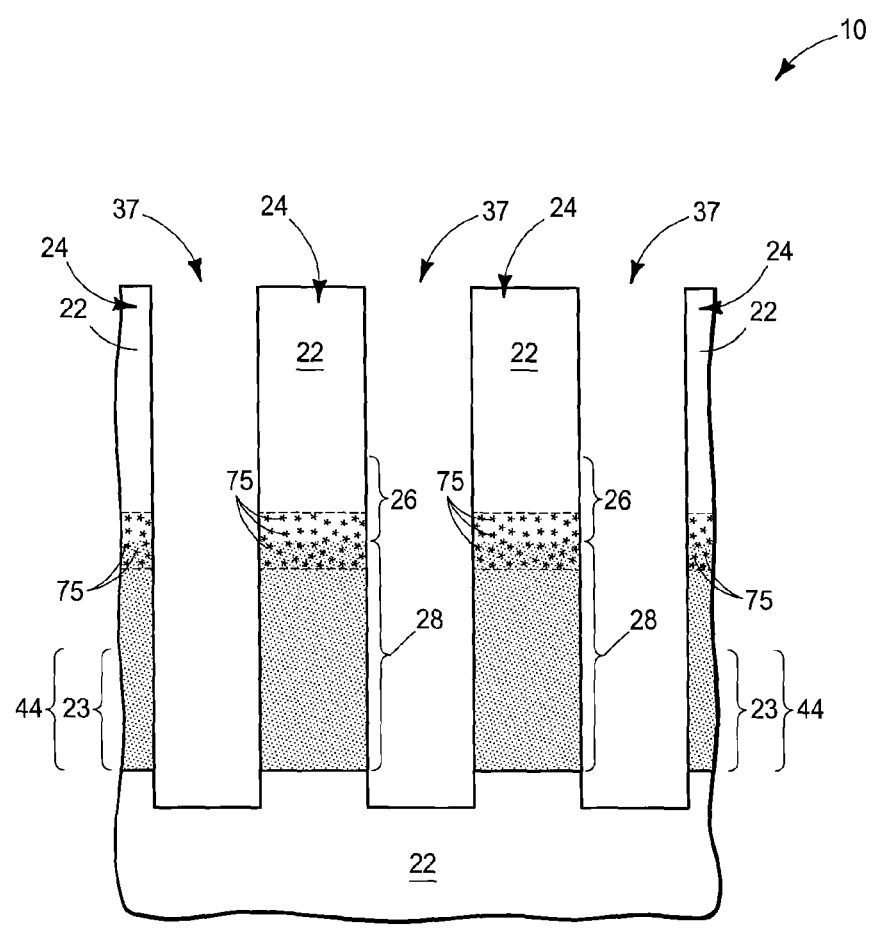
FIG. 15 is a view of the FIG. 13 substrate fragment at a processing step subsequent to that shown by FIG. 13, and corresponds in processing sequence to that of FIG. 14.

Individual conductive data/sense lines 44 are ultimately formed. As an example, the set of heating conditions may interconnect the laterally-spaced conductively-doped n-type regions (as shown in FIGS. 10 and 11) within region 23 as is shown in FIGS. 12 and 13. In one embodiment, forming the data/sense lines includes etching deeper into silicon-comprising semiconductor material 22, and in one embodiment etching through region 23. For example as shown in FIGS. 14 and 15, region 23 has been etched through to form data/sense lines 44. As an alternate example, silicon-comprising material 22 might be etched first to form the lines (not shown) and then the substrate subjected to the set of heating conditions to interconnect laterally-spaced conductively-doped n-type regions. Further, data/sense lines may be formed that only include one or more buried metal lines (not shown) wherein conductively-doped semiconductor material is not received between adjacent inner source/drain regions 28. Regardless, if pedestals 24 have not yet been circumferentially formed, they may be so formed by etching orthogonally oriented parallel trenches after the example FIGS. 14 and 15 etching has been conducted.

Processing may continue in forming a structure as shown and described relative to FIGS. 1-5, or otherwise, and is not germane to invention herein.

Conductivity-neutral dopant may be provided within the silicon-comprising semiconductor material using techniques other than ion implantation in the above and other embodiments. Further and regardless, the FIGS. 6-15 processing shows formation of conductivity-neutral dopant within the silicon-comprising semiconductor material before the n-type dopant is so provided. This relationship may be reversed whereby the n-type dopant which comprises part of the inner source/drain regions is formed in the silicon-comprising semiconductor material before the conductivity-neutral dopant is provided in the silicon-comprising semiconductor material.

Figure 16:
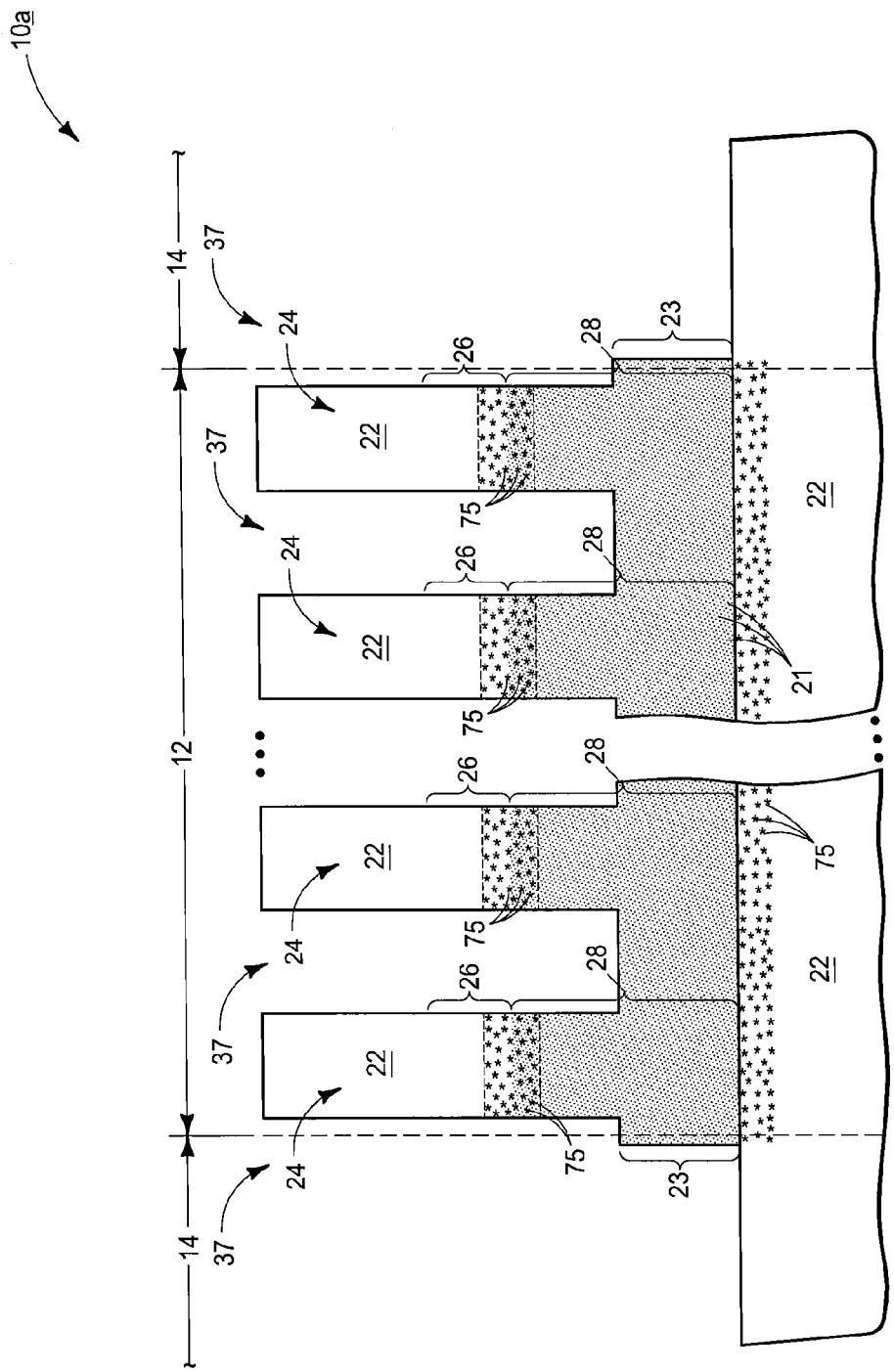
FIG. 16 is a view of an alternate embodiment substrate fragment, and corresponds in position to the cross-section of the FIG. 14 substrate fragment.
Figure 17:
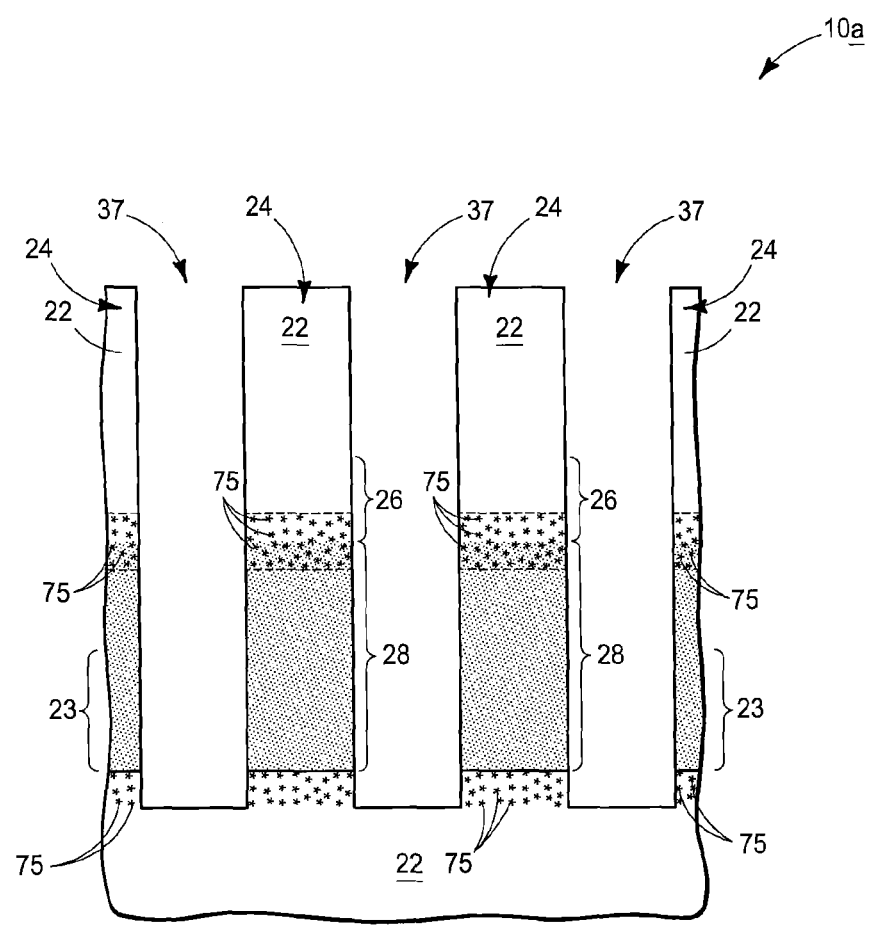
FIG. 17 is a view of the FIG. 16 substrate fragment, and corresponds in position to the cross-section of the FIG. 15 substrate fragment.

An additional example embodiment is described with reference to FIGS. 16 and 17 with respect to a substrate fragment 10a. Like numerals from the above described embodiments have been used where appropriate, with some construction differences being indicated with the suffix "a" or with different numerals. FIGS. 16 and 17 show example additional processing having been conducted with respect to the FIGS. 14 and 15 substrate either prior to or thereafter, but regardless prior to subjecting the silicon-comprising semiconductor material to the set of heating conditions as shown by FIGS. 12 and 13. Specifically, conductivity-neutral dopant 75 has also been provided into silicon-comprising semiconductor material 22 that is immediately elevationally inward of location of region 23. Such conductivity-neutral dopant 75 has the same attributes as described in the above method embodiments regarding restricting diffusion of at least one of As and P in silicon-comprising semiconductor material, although may not necessarily be the same composition dopant(s). Providing a region of silicon-comprising semiconductor material containing at least one of As and P that is bounded on different sides (e.g., top and bottom) by conductivity-neutral dopant 75 would restrict diffusion of As and/or P in two different (e.g., opposite) directions.

Figure 18:
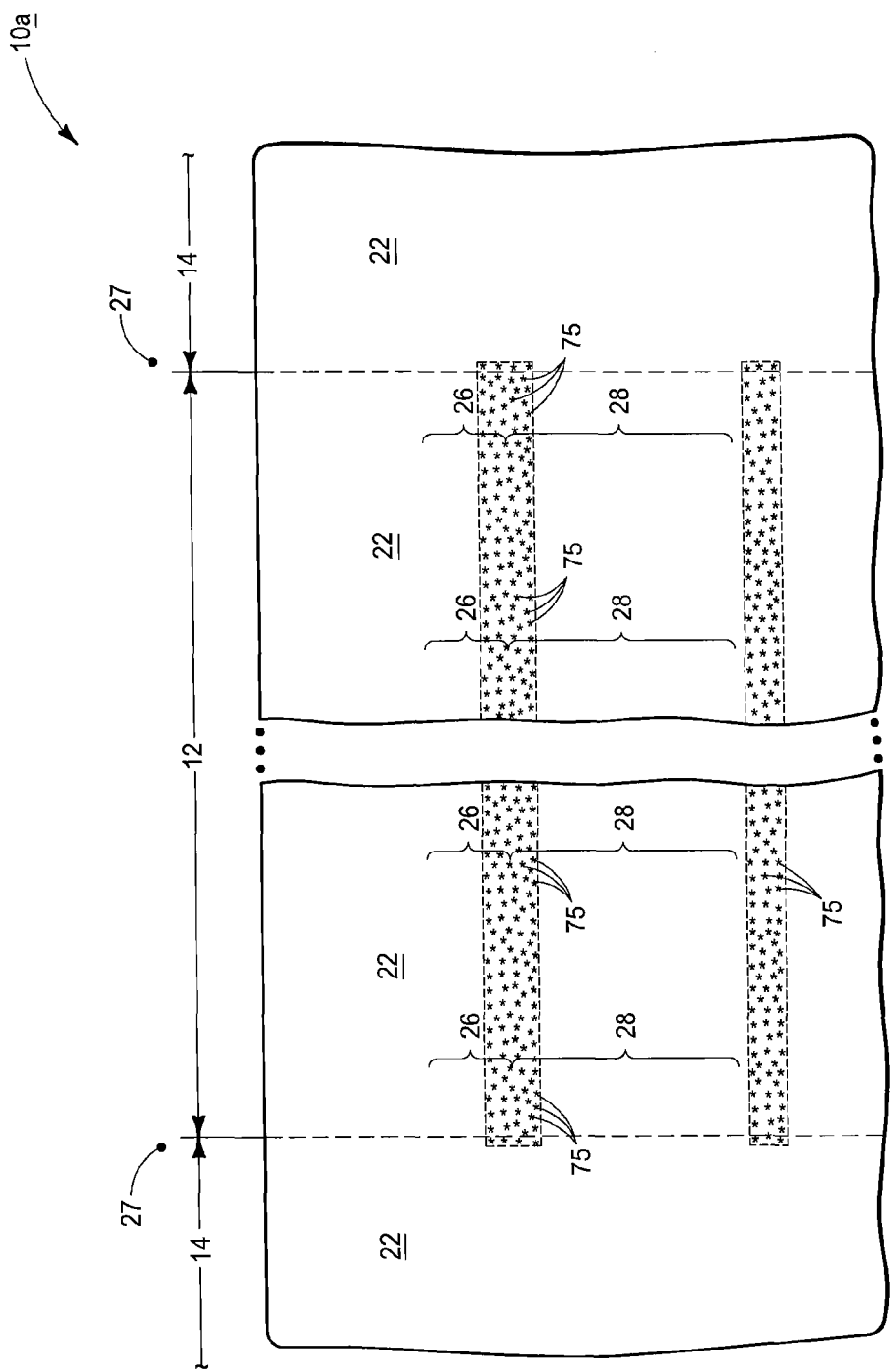
FIG. 18 is a view of a predecessor substrate fragment to that of FIG. 16.
Figure 19:
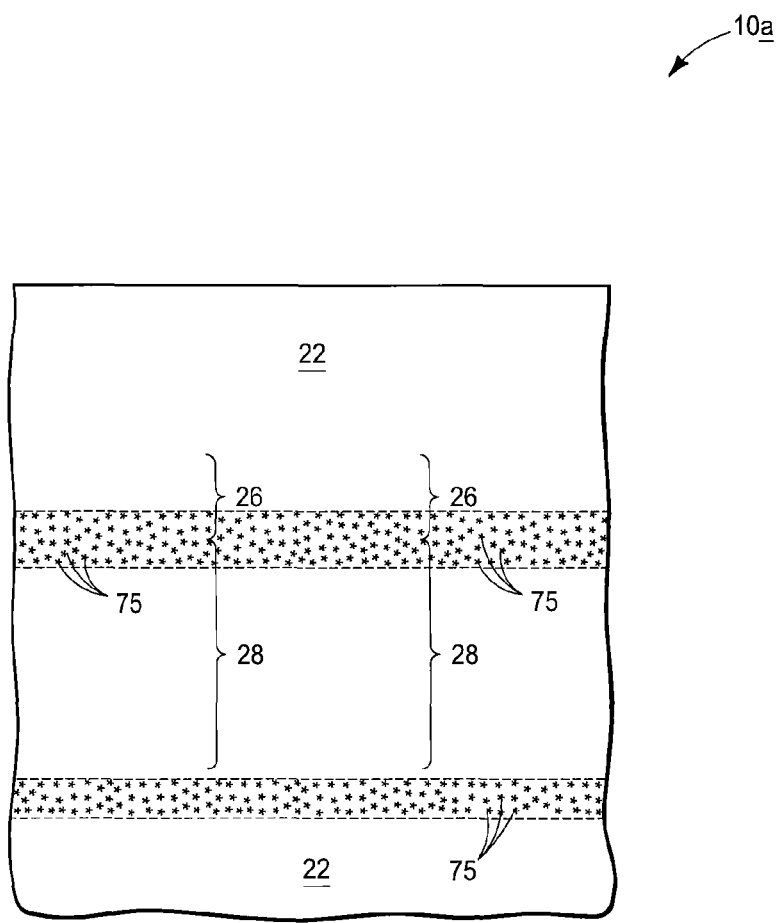
FIG. 19 is a view of the predecessor substrate fragment positionally corresponding to the FIG. 17 cut.

FIGS. 18 and 19 show but one example processing of a predecessor substrate fragment 10a to that of FIGS. 16 and 17, respectively. FIGS. 18 and 19 correspond in processing sequence to that of FIGS. 7 and 8, and show conductivity-neutral dopant 75 having also been provided into silicon-comprising semiconductor material 22 that is immediately elevationally inward of location of region 23 prior to providing at least one of As and P into the silicon-comprising semiconductor material in inner source/drain region locations 28.

Embodiments of the invention also include a method of forming an n-type field effect transistor independent of whether fabricated in connection with formation of vertically-oriented transistors, and even if so independent of the above described structures. Such a method includes providing a conductivity-neutral dopant in silicon-comprising semiconductor material in at least one of a channel region location and a first source/drain region location of a field effect transistor being formed. N-type dopant is provided in the silicon-comprising semiconductor material in a second source/drain region location and in the first source/drain region location. The n-type dopant at least in the first source/drain region location comprises at least one of As and P. The silicon-comprising semiconductor material is subjected to a set of heating conditions. The conductivity-neutral dopant restricts diffusion of the As and/or P in the silicon-comprising semiconductor material from the first source/drain region location to the channel region location than would otherwise occur under the set of heating conditions in the absence of the conductivity-neutral dopant. A channel region is ultimately formed, as is a gate construction operatively proximate the channel region.

One or both of the providing of the n-type and conductivity-neutral dopants may occur by ion implantation or other technique and/or otherwise as described above. Further either may be provided within the silicon-comprising semiconductor material before or after the other. Any other attribute as described above may be used in such methods of forming transistors.

Any of the embodiments disclosed herein may be combined with any aspect of the disclosure of U.S. patent application Ser. No. 13/591,065, filed on the same day as the application for this patent, naming Yongjun Jeff Hu and Allen McTeer as inventors, and entitled "Arrays Comprising Vertically-Oriented Transistors, Integrated Circuitry Comprising A Conductive Line Buried In Silicon-Comprising Semiconductor Material, Methods Of Forming A Plurality Of Conductive Lines Buried In Silicon-Comprising Semiconductor Material, And Methods Of Forming An Array Comprising Vertically-Oriented Transistors".

CONCLUSION

In some embodiments, a method of forming an n-type field effect transistor comprises providing a conductivity-neutral dopant in silicon-comprising semiconductor material in at least one of a channel region location and a first source/drain region location of a field effect transistor being formed. N-type dopant is provided in the silicon-comprising semiconductor material in a second source/drain region location and in the first source/drain region location. The n-type dopant at least in the first source/drain region location comprises at least one of As and P. The silicon-comprising semiconductor material is subjected to a set of heating conditions. The conductivity-neutral dopant restricts diffusion of the at least one of As and P in the silicon-comprising semiconductor material from the first source/drain region location to the channel region location than would otherwise occur under the set of heating conditions in the absence of the conductivity-neutral dopant. A channel region is formed and a gate construction is formed operatively proximate the channel region.

In some embodiments, a method includes forming an array comprising vertically-oriented n-type transistors. The transistors individually comprise an elevationally outer source/drain region, an elevationally inner source/drain region comprising silicon-comprising semiconductor material that is conductively-doped n-type with at least one of As and P, and a silicon-comprising semiconductor material channel region elevationally between the inner and outer source/drain regions. A conductivity-neutral dopant is ion implanted into silicon-comprising semiconductor material in at least one of a location of the channel region and a location of the inner source/drain region of individual of the vertically-oriented transistors being formed. At least one of As and P is provided into the silicon-comprising semiconductor material in the inner source/drain region locations to at least partially form the inner source/drain regions. The silicon-comprising semiconductor material is subjected to a set of heating conditions. The conductivity-neutral dopant restricts diffusion of the at least one of As and P in the silicon-comprising semiconductor material from the inner source/drain region locations to the channel region locations than would otherwise occur under the set of heating conditions in the absence of the conductivity-neutral dopant. The channel region is formed as is a gate construction operatively proximate the channel region.

In some embodiments, an n-type field effect transistor includes silicon-comprising semiconductor material comprising a pair of source/drain regions having a channel region there-between. At least one of the source/drain regions is conductively doped n-type with at least one of As and P. A conductivity-neutral dopant is in the silicon-comprising semiconductor material in at least one of the channel region and the at least one source/drain region. A gate construction is operatively proximate the channel region.

In some embodiments, an array comprises n-type vertically-oriented transistors, including rows of access lines and columns of data/sense lines. Individual vertically-oriented transistors comprise silicon-comprising semiconductor material comprising an elevationally outer source/drain region, an elevationally inner source/drain region, and a channel region elevationally between the inner and outer source/drain regions. At least the inner source/drain region is conductively doped n-type with at least one of As and P. A conductivity-neutral dopant is in the silicon-comprising semiconductor material in at least one of the channel region and the inner source/drain region. Individual of the rows comprise an access line interconnecting transistors in that row. Individual of the columns comprise a data/sense line interconnecting transistors in that column.

In some embodiments, a method of forming an array comprising vertically-oriented n-type transistors includes transistors individually comprising an elevationally outer source/drain region, an elevationally inner source/drain region comprising silicon-comprising semiconductor material that is conductively-doped n-type with at least one of As and P, and a silicon-comprising semiconductor material channel region elevationally between the inner and outer source/drain regions. Gates of the vertically-oriented transistors comprise rows of access lines. Individual of the rows comprising an access line interconnecting transistors in that row. Columns of data/sense lines are provided. Individual of the columns comprise a data/sense line interconnecting transistors in that column. Individual of the data/sense lines comprise continuously running conductively As-doped and/or P-doped silicon-comprising semiconductor material. The method comprises ion implanting a conductivity-neutral dopant into silicon-comprising semiconductor material in at least one of a location of the channel region and a location of the inner source/drain region of individual of the vertically-oriented transistors being formed. A conductivity-neutral dopant is ion implanted into silicon-comprising semiconductor material that is immediately elevationally inward of a location of the continuously running conductively As and/or P doped silicon-comprising semiconductor material. After ion implanting conductivity-neutral dopant in at least one of the location of the channel region and the location of the inner source/drain region and after ion implanting conductivity neutral dopant that is immediately elevationally inward of the location of continuously running conductively As and/or P doped silicon-comprising semiconductor material, at least one of As and P is provided into the silicon-comprising semiconductor material in the inner source/drain region locations to at least partially form the inner source/drain regions. The silicon-comprising semiconductor material is subjected to a set of heating conditions. The conductivity-neutral dopant that is in at least one of a location of the channel region and a location of the inner source/drain region of individual of the vertically-oriented transistors being formed restricts diffusion of the at least one of As and P in the silicon-comprising semiconductor material from the inner source/drain region locations to the channel region locations than would otherwise occur under the set of heating conditions in the absence of the conductivity-neutral dopant. The conductivity-neutral dopant that is in said immediately elevationally inward silicon-comprising semiconductor material restricting diffusion of the at least one of As and P in the continuously running conductively As and/or P doped silicon-comprising semiconductor material, into said immediately elevationally inward silicon-comprising semiconductor material than would otherwise occur under the set of heating conditions in the absence of the conductivity-neutral dopant in said immediately elevationally inward silicon-comprising semiconductor material. The channel region is formed, as is a gate construction operatively proximate the channel region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An n-type field effect transistor comprising:
silicon-comprising semiconductor material comprising a pair of source/drain regions having a channel region there-between, at least one of the source/drain regions being conductively doped n-type with at least one of As and P, a conductivity-neutral dopant in the silicon-comprising semiconductor material in at least the channel region; and
a gate construction operatively proximate the channel region.

2. A memory cell incorporating the n-type field effect transistor of claim 1.

3. The memory cell of claim 2 comprising a charge storage device electrically coupled to at least one of the pair of source/drain regions.

4. The n-type field effect transistor of claim 1 wherein the n-type dopant comprises P and the conductivity-neutral dopant comprises N.

5. The n-type field effect transistor of claim 1 wherein the n-type dopant comprises P and the conductivity-neutral dopant comprises C.

6. The n-type field effect transistor of claim 1 wherein the conductivity-neutral dopant comprises N.

7. The n-type field effect transistor of claim 1 wherein the conductivity-neutral dopant comprises a concentration of from about $1 \times 10^{19}$ atoms/cm$^3$ to about $1 \times 10^{22}$ atoms/cm$^3$ in the silicon-comprising semiconductor material.

8. The n-type field effect transistor of claim 1 wherein the conductivity-neutral dopant is provided in less than all of the channel region.

9. The n-type field effect transistor of claim 1 wherein the conductivity-neutral dopant is provided only in the channel region.

10. The n-type field effect transistor of claim 1 wherein the conductivity-neutral dopant is provided in both the channel region and in the first source/drain region.

11. The n-type field effect transistor of claim 10 wherein the conductivity-neutral dopant is provided in less than all of the first source/drain region.

12. The n-type field effect transistor of claim 10 wherein the conductivity-neutral dopant is provided in less than all of the channel region and in less than all of the first source/drain region.

13. The n-type field effect transistor of claim 10 wherein the conductivity-neutral dopant is provided across an interface of the channel region and the first source/drain region.

14. The n-type field effect transistor of claim 13 wherein the conductivity-neutral dopant is provided in less than all of the channel region and in less than all of the first source/drain region.

15. An array comprising n-type vertically-oriented transistors, the array comprising rows of access lines and columns of data/sense lines, the array comprising:
individual vertically-oriented transistors comprising silicon-comprising semiconductor material comprising an elevationally outer source/drain region, an elevationally inner source/drain region, and a channel region elevationally between the inner and outer source/drain regions; at least the inner source/drain region being conductively doped n-type with at least one of As and P; a conductivity-neutral dopant in the silicon-comprising semiconductor material in at least the channel region;
individual of the rows comprising an access line interconnecting transistors in that row; and
individual of the columns comprising a data/sense line interconnecting transistors in that column.

16. An array of memory cells comprising the vertically-oriented transistors of claim 15, individual of the memory cells comprising individual of the vertically-oriented transistors.

17. The array of memory cells of claim 16 comprising a charge storage device electrically coupled to at least one of the pair of source/drain regions.

18. The n-type field effect transistor of claim 15 wherein the conductivity-neutral dopant is provided in less than all of the channel region.

19. The n-type field effect transistor of claim 15 wherein the conductivity-neutral dopant is provided only in the channel region.

20. The n-type field effect transistor of claim 15 wherein the conductivity-neutral dopant is provided in both the channel region and in the inner source/drain region.

21. An n-type field effect transistor comprising:
silicon-comprising semiconductor material comprising a pair of source/drain regions having a channel region there-between, at least one of the source/drain regions being conductively doped n-type with at least one of As and P, a conductivity-neutral dopant in the silicon-comprising semiconductor material in at least one of the channel region and the at least one source/drain region, the conductivity-neutral dopant comprising S; and
a gate construction operatively proximate the channel region.

22. An array comprising n-type vertically-oriented transistors, the array comprising rows of access lines and columns of data/sense lines, the array comprising:
individual vertically-oriented transistors comprising silicon-comprising semiconductor material comprising an elevationally outer source/drain region, an elevationally inner source/drain region, and a channel region elevationally between the inner and outer source/drain regions; at least the inner source/drain region being conductively doped n-type with at least one of As and P, a conductivity-neutral dopant in the silicon-comprising semiconductor material in at least one of the channel region and the inner source/drain region, the conductivity-neutral dopant comprising S;
individual of the rows comprising an access line interconnecting transistors in that row; and
individual of the columns comprising a data/sense line interconnecting transistors in that column.

\* \* \* \* \*